(12) United States Patent
Imanaka

(10) Patent No.: US 12,707,658 B2
(45) Date of Patent: Aug. 11, 2026

(54) METHOD FOR MANUFACTURING CAPACITOR

(71) Applicant: Panasonic Intellectual Property Management Co., Ltd., Osaka (JP)

(72) Inventor: Takashi Imanaka, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 599 days.

(21) Appl. No.: 18/256,360

(22) PCT Filed: Dec. 6, 2021

(86) PCT No.: PCT/JP2021/044689

§ 371 (c)(1),
(2) Date: Jun. 7, 2023

(87) PCT Pub. No.: WO2022/131048

PCT Pub. Date: Jun. 23, 2022

(65) Prior Publication Data

US 2024/0021376 A1 Jan. 18, 2024

(30) Foreign Application Priority Data

Dec. 18, 2020 (JP) ................................ 2020-210566
Dec. 18, 2020 (JP) ................................ 2020-210567

(51) Int. Cl.
*H10D 1/68* (2025.01)
*H10D 1/00* (2025.01)

(52) U.S. Cl.
CPC ............... *H10D 1/68* (2025.01); *H10D 1/041* (2025.01); *H10D 1/692* (2025.01)

(58) Field of Classification Search
CPC ............ H10D 1/60; H10D 1/68; H10D 1/692; H10D 1/696; H10D 1/711; H10D 1/712;
(Continued)

(56) References Cited

U.S. PATENT DOCUMENTS 5,739,565 A * 4/1998 Nakamura ........... H10B 12/038
257/E21.651
8,487,405 B2 * 7/2013 Tian ....................... H10D 1/716
257/532

(Continued)

FOREIGN PATENT DOCUMENTS

WO 2019/021817 A1 1/2019
WO 2019/058922 A1 3/2019
WO 2020/184517 A1 9/2020

OTHER PUBLICATIONS

International Search Report dated Feb. 22, 2022 issued in International Patent Application No. PCT/JP2021/044689 with English translation.

*Primary Examiner* — Eduardo A Rodela
(74) *Attorney, Agent, or Firm* — Rimon P.C.

(57) ABSTRACT

A method for manufacturing a capacitor includes a groove forming, a masking layer forming, a porous part forming, a dielectric layer forming, and a conductor layer forming. A silicon substrate having a first surface and a second surface and including a capacitance generation region and a non-capacitance generation region is prepared, and a groove recessed from the first surface toward the second surface is formed at a boundary between the capacitance generation region and the non-capacitance generation region. A masking layer including a first masking part and a second masking part is formed on the first surface of the silicon substrate. A porous part having fine pores is formed in the capacitance generation region of the silicon substrate by an anodic oxidation process. A dielectric layer is formed on inner surfaces of the fine pores. A conductor layer including a first conductive part and a second conductive part is formed.

11 Claims, 19 Drawing Sheets

(58) Field of Classification Search
CPC ...... H10D 1/716; H10D 84/038; H10D 1/041; H10D 1/043; H01G 4/33; H01G 4/005; H01G 4/228; H01L 21/3205; H01L 21/76; H01L 21/761
See application file for complete search history.

(56) References Cited

U.S. PATENT DOCUMENTS

| | | | | |
|---|---|---|---|---|
| 11,784,000 | B2 * | 10/2023 | Yoshida | H01G 4/008<br>361/305 |
| 11,948,995 | B2 * | 4/2024 | Yoshida | H01L 21/28 |
| 2015/0145104 | A1 * | 5/2015 | Bauer | H10D 1/692<br>438/381 |
| 2015/0214244 | A1 * | 7/2015 | Ho | H10D 84/811<br>438/386 |
| 2018/0277622 | A1 * | 9/2018 | Nishiyama | H01L 25/00 |
| 2020/0066445 | A1 | 2/2020 | Nakagawa et al. | |
| 2020/0119137 | A1 | 4/2020 | Takeuchi et al. | |
| 2021/0407734 | A1 | 12/2021 | Yoshida et al. | |

* cited by examiner 2
21
22
31
32
4
5
51
52
520
211
213
X
Y
Z 32
212
211
31
7
4
6
60
2
9
8
82
210
8 (81)
X
Y
Z

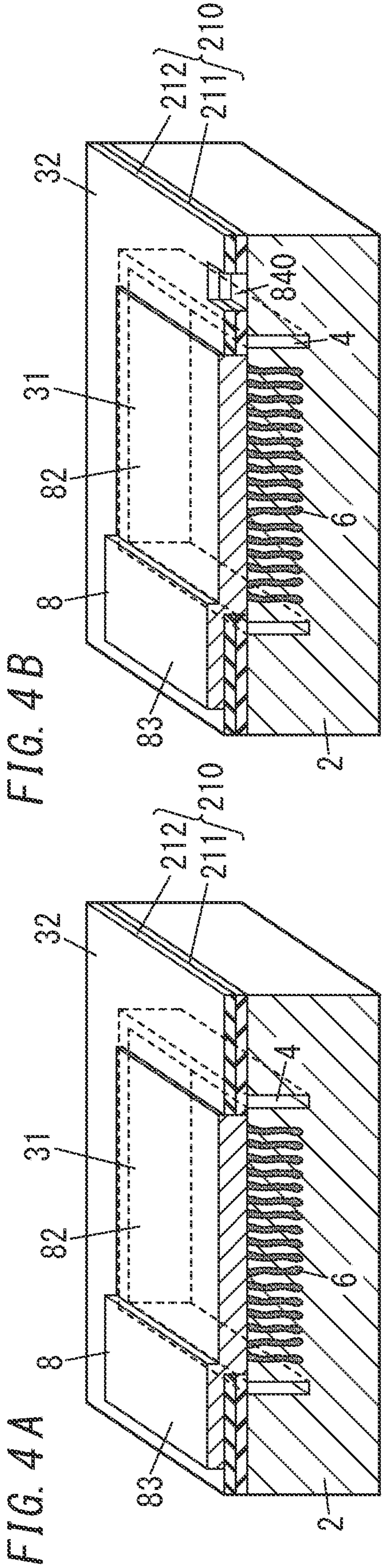
FIG. 4B
32
212
211
210
31
82
8
83
840
4
6
2
FIG. 4A
32
212
211
210
31
82
8
83
4
6
2
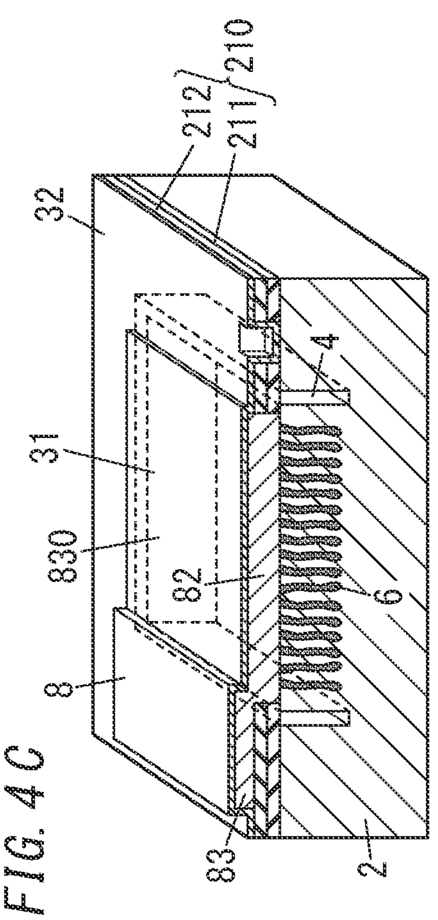
FIG. 4C
32
212
211
210
31
830
82
8
83
4
6
2

32
31
32
5
21
4
2
9
22

32
31
32
5(41)
21
4
2
9
22

32
31
32
5(42)
21
4
43
43
2
9
22

32
31
32
5
21
24
24
4
43
43
2
9
22

FIG. 6A
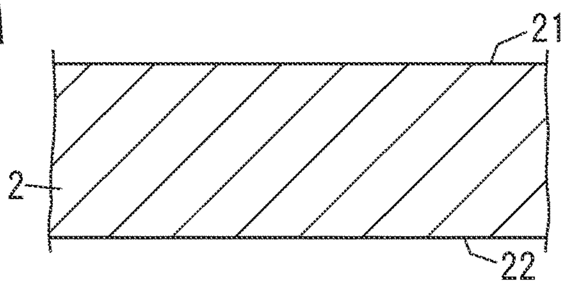
FIG. 6B
32 31 32
21
4
2
22
FIG. 6C
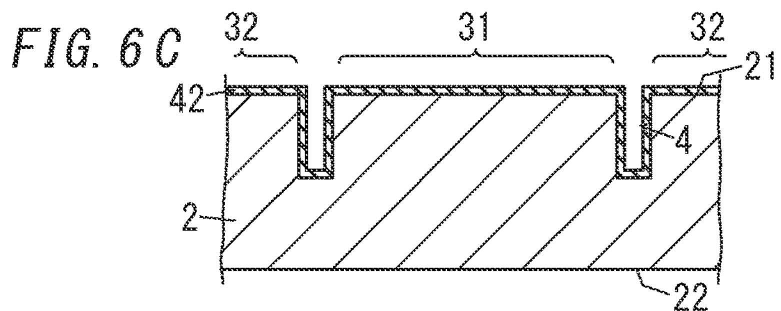
FIG. 6D
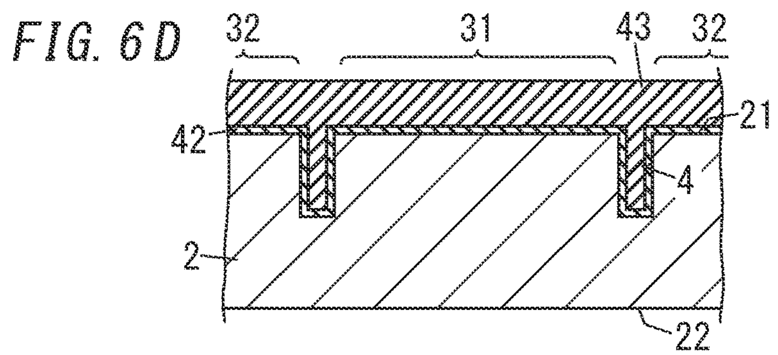
FIG. 6E
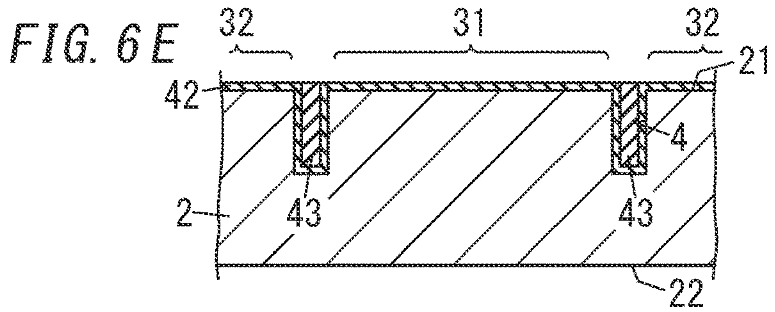

FIG. 7A
21
2
22
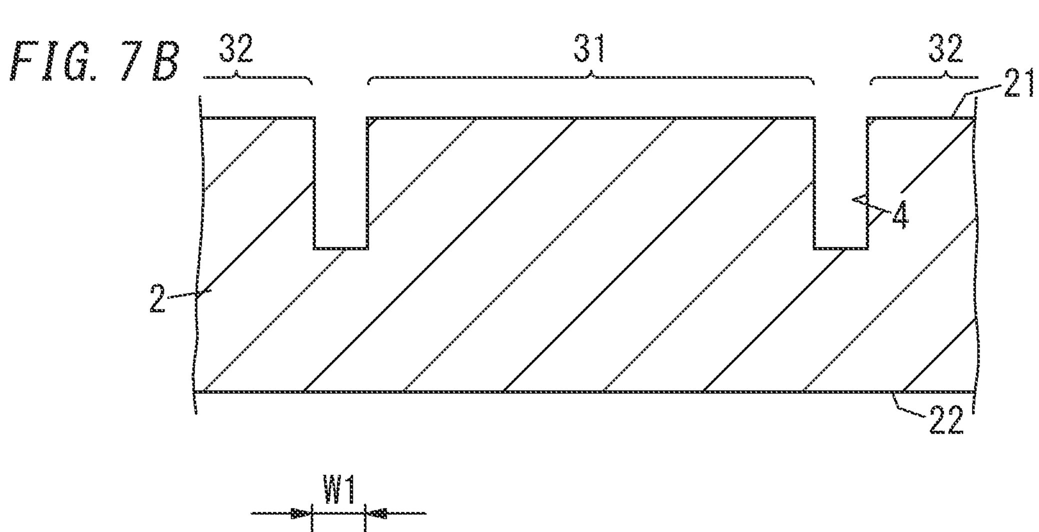
FIG. 7B
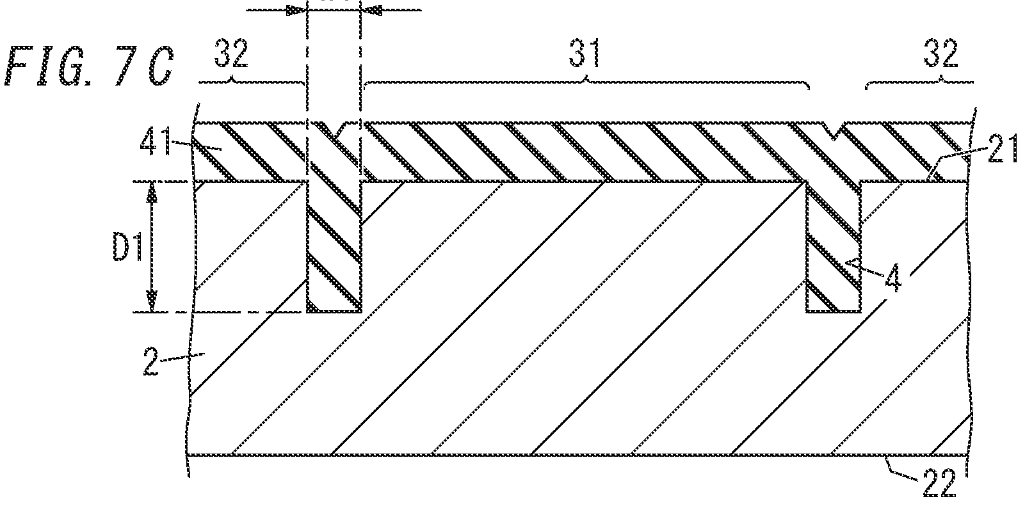
FIG. 7C 2
21
22
Z
Y
X 5
31
32
211
213
2

5
51
52
520
31
32
211
9
2

32
212
211
31
6
60
9
2
Z
Y
X 32
212
211
31
7
6
2
60

32
212
211
210
31
82
8
6
2
8(81)
60
7

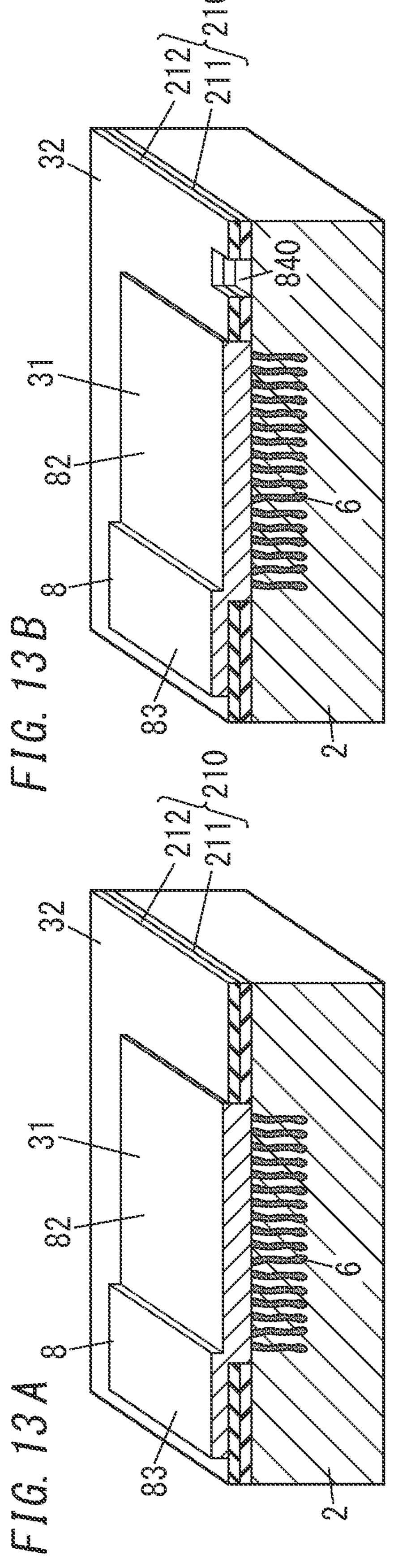
FIG. 13B
32
212
211
210
840
31
82
6
8
83
2
FIG. 13A
32
212
211
210
31
82
6
8
83
2
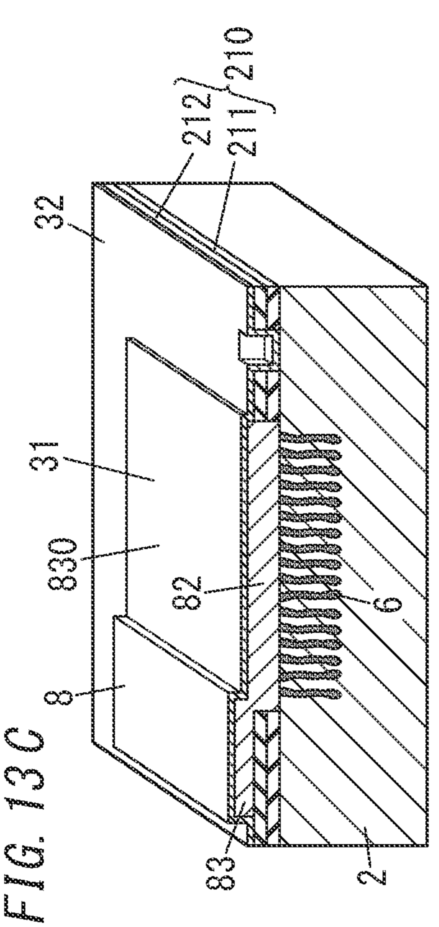
FIG. 13C
32
212
211
210
31
830
82
6
8
83
2

32
31
32
5
2
90
9
90

32
31
32
5
2
42
4
9

32
31
32
5
21
2
4
23
9
41

32
31
32
5
21
2
23
23
L13
L12
22
9

METHOD FOR MANUFACTURING CAPACITOR

CROSS-REFERENCE OF RELATED APPLICATIONS

This application is the U.S. National Phase under 35 U.S.C. § 371 of International Patent Application No. PCT/JP2021/044689, filed on Dec. 6, 2021, which in turn claims the benefit of Japanese Patent Application No. 2020-210566, filed on Dec. 18, 2020, and Japanese Patent Application No. 2020-210567, filed on Dec. 18, 2020, the entire disclosures of which Applications are incorporated by reference herein.

TECHNICAL FIELD

The present disclosure generally relates to methods for manufacturing capacitors, and more specifically, relates to a method for manufacturing a capacitor including a silicon substrate.

BACKGROUND ART

Patent Literature 1 discloses a method for manufacturing a capacitor. This method manufactures a capacitor in the following manner.

First, a masking layer is provided on a non-capacitance generation region of a silicon substrate having a principal surface including a capacitance generation region and the non-capacitance generation region. Next, a porous part is formed by an anodic oxidation process in the capacitance generation region in a thickness direction of the silicon substrate by forming fine pores in the capacitance generation region which is not covered with the masking layer. Then, a dielectric layer is formed on inner surfaces of the fine pores. Thereafter, a conductor layer is formed including a filling part filled in at least part of the fine pores and a surface layer part at least covering part of a surface of the capacitance generation region.

The capacitor is thus manufactured.

According to the method for manufacturing the capacitor of Patent Literature 1, a corner of the porous part may extend, from a portion overlapping the capacitance generation region of the silicon substrate in the thickness direction, into a portion overlapping the non-capacitance generation region of the silicon substrate in the thickness direction (see FIG. 1B of Patent Literature 1). If the corner of the porous part extends as explained above, the thickness of the dielectric layer formed on the inner surface of the fine pores of the corner is assumed to be uneven.

CITATION LIST

Patent Literature

Patent Literature 1: WO 2020/184517 A1

SUMMARY OF INVENTION

It is an object of the present disclosure to provide a method for manufacturing a capacitor whose porous part is suppressed from being formed in a non-capacitance generation region.

A method for manufacturing a capacitor according to an aspect of the present disclosure includes a groove forming step, a masking layer forming step, a porous part forming step, a dielectric layer forming step, and a conductor layer forming step. The groove forming step includes preparing a silicon substrate having a first surface and a second surface opposite the first surface. The silicon substrate includes a capacitance generation region and a non-capacitance generation region which is a region other than the capacitance generation region when viewed along a direction connecting the first surface and the second surface. The groove forming step further includes forming a groove at a boundary between the capacitance generation region and the non-capacitance generation region. The groove is recessed from the first surface toward the second surface. The masking layer forming step includes forming a masking layer on the first surface of the silicon substrate. The masking layer includes a first masking part covering the non-capacitance generation region and a second masking part not covering at least part of the capacitance generation region. The porous part forming step includes forming a porous part in the capacitance generation region of the silicon substrate by an anodic oxidation process. The porous part has fine pores. The dielectric layer forming step includes forming a dielectric layer on inner surfaces of the fine pores. The conductor layer forming step includes forming a conductor layer including a first conductive part and a second conductive part electrically connected to the first conductive part. The first conductive part is in contact with the dielectric layer. The second conductive part is in the capacitance generation region of the first surface.

A method for manufacturing a capacitor according to an aspect of the present disclosure includes an n-type semiconductor part forming step, a masking layer forming step, a porous part forming step, a dielectric layer forming step, and a conductor layer forming step. The n-type semiconductor part forming step includes preparing a silicon substrate which is a p-type semiconductor. The silicon substrate has a first surface and a second surface opposite the first surface. The silicon substrate includes a capacitance generation region and a non-capacitance generation region which is a region other than the capacitance generation region when viewed along a direction connecting the first surface and the second surface. The n-type semiconductor part forming step further includes forming an n-type semiconductor part at a boundary between the capacitance generation region and the non-capacitance generation region. The n-type semiconductor part extends from the first surface toward the second surface. The masking layer forming step includes forming a masking layer on the first surface of the silicon substrate. The masking layer includes a first masking part covering the non-capacitance generation region and a second masking part not covering at least part of the capacitance generation region. The porous part forming step includes forming a porous part in the capacitance generation region of the silicon substrate by an anodic oxidation process. The porous part has fine pores. The dielectric layer forming step includes forming a dielectric layer on inner surfaces of the fine pores. The conductor layer forming step includes forming a conductor layer including a first conductive part and a second conductive part electrically connected to the first conductive part. The first conductive part is in contact with the dielectric layer. The second conductive part is in the capacitance generation region of the first surface.

A method for manufacturing a capacitor according to an aspect of the present disclosure includes a masking layer forming step, a porous part forming step, a dielectric layer forming step, and a conductor layer forming step. The masking layer forming step includes preparing a silicon substrate having a first surface and a second surface opposite the first surface. The silicon substrate includes a capacitance generation region and a non-capacitance generation region which is a region other than the capacitance generation region when viewed along a direction connecting the first surface and the second surface. The masking layer forming step further includes forming a masking layer on the first surface of the silicon substrate. The masking layer includes a first masking part covering the non-capacitance generation region and a second masking part not covering at least part of the capacitance generation region. The porous part forming step includes forming a backside electrode having a same shape as the capacitance generation region at a same location as the capacitance generation region on the second surface of the silicon substrate when viewed along the direction connecting the first surface and the second surface. The porous part forming step further includes forming a porous part in the capacitance generation region of the silicon substrate by an anodic oxidation process by using the backside electrode as an anode. The porous part has fine pores. The dielectric layer forming step includes forming a dielectric layer on inner surfaces of the fine pores. The conductor layer forming step includes forming a conductor layer including a first conductive part and a second conductive part electrically connected to the first conductive part. The first conductive part is in contact with the dielectric layer. The second conductive part is in the capacitance generation region of the first surface.

A method for manufacturing a capacitor according to an aspect of the present disclosure includes a masking layer forming step, a low-resistance part forming step, a porous part forming step, a dielectric layer forming step, and a conductor layer forming step. The masking layer forming step includes preparing a silicon substrate having a first surface and a second surface opposite the first surface. The silicon substrate includes a capacitance generation region and a non-capacitance generation region which is a region other than the capacitance generation region when viewed along a direction connecting the first surface and the second surface. The masking layer forming step further includes forming a masking layer on the first surface of the silicon substrate. The masking layer includes a first masking part covering the non-capacitance generation region and a second masking part not covering at least part of the capacitance generation region. The low-resistance part forming step includes forming a low-resistance part having a same shape as the capacitance generation region at a same location as the capacitance generation region in the silicon substrate when viewed along the direction connecting the first surface and the second surface. The low-resistance part has a lower specific resistance than the silicon substrate and extends from the second surface toward the first surface. The porous part forming step includes forming a porous part in the capacitance generation region of the silicon substrate by an anodic oxidation process. The porous part has fine pores. The dielectric layer forming step includes forming a dielectric layer on inner surfaces of the fine pores. The conductor layer forming step includes forming a conductor layer including a first conductive part and a second conductive part electrically connected to the first conductive part. The first conductive part is in contact with the dielectric layer. The second conductive part is in the capacitance generation region of the first surface.

BRIEF DESCRIPTION OF DRAWINGS

FIG. 4A to FIG. 4C are schematic perspective views of an example of a method for manufacturing the capacitor;

FIGS. 6A to 6E are schematic sectional views of an example of a formation method of the groove;

FIGS. 7A to 7C are schematic sectional views of an example of the formation method of the groove;

FIGS. 13A to 13C are schematic perspective views of an example of the method for manufacturing the capacitor of the third embodiment;

DESCRIPTION OF EMBODIMENTS

1. First Embodiment (Overview)

As described above, in the method for manufacturing the capacitor of Patent Literature 1, the corner of the porous part may extend, from the portion overlapping the capacitance generation region of the silicon substrate in the thickness direction, into the portion overlapping the non-capacitance generation region of the silicon substrate in the thickness direction (see FIG. 1B of Patent Literature 1).

Figure 19:
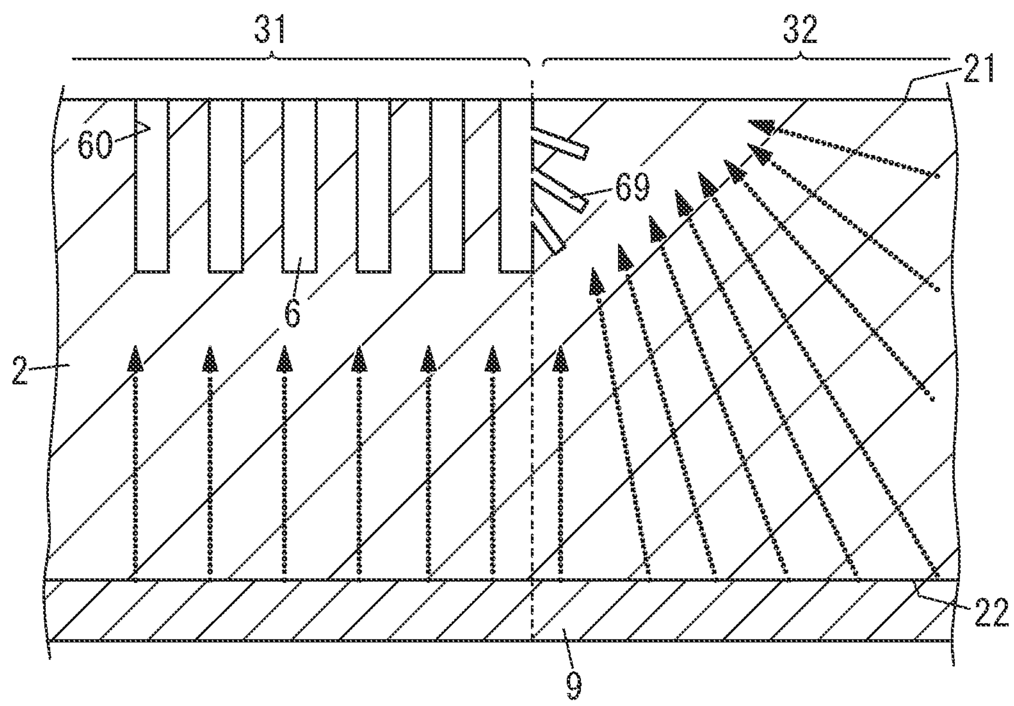
FIG. 19 is a view explaining a phenomenon which may occur when the anodic oxidation process is performed.

FIG. 19 shows a phenomenon which may occur when an anodic oxidation process is performed. That is, the anodic oxidation process may be performed by immersing a silicon substrate 2 and a platinum electrode (not shown) in hydrofluoric acid and supplying electric power by using a backside electrode 9 of the silicon substrate 2 as an anode and the platinum electrode as a cathode. Note that in FIG. 19, a masking layer 5 covering at least a non-capacitance generation region 32 of a first surface 21 of the silicon substrate 2 is omitted.

In the silicon substrate 2 shown in FIG. 19, however, the direction of an electric field may be peculiar at a boundary between a capacitance generation region 31 and the non-capacitance generation region 32. Here, the direction of the electric field is indicated by dotted line arrows in FIG. 19.

Specifically, in the capacitance generation region 31, the direction of the electric field is a direction from a second surface 22 toward the first surface 21. That is, in the capacitance generation region 31, the direction of the electric field can be substantially parallel to a thickness direction defined with respect to the silicon substrate 2. On the other hand, in the non-capacitance generation region 32, the direction of the electric field may tilt from the non-capacitance generation region 32 toward the capacitance generation region 31 as the electric field extends from the second surface 22 toward the first surface 21.

Therefore, a porous part 6 is formed not only in the capacitance generation region 31 but can be formed also in the non-capacitance generation region 32. That is, part of the porous part 6 is assumed to protrude from the capacitance generation region 31 toward the non-capacitance generation region 32, and thereby, tilted fine pores 69 may be formed. The tilted fine pores 69 are fine pores tilted from the capacitance generation region 31 of the first surface 21 toward the non-capacitance generation region 32 of the second surface 22.

Figure 9A:
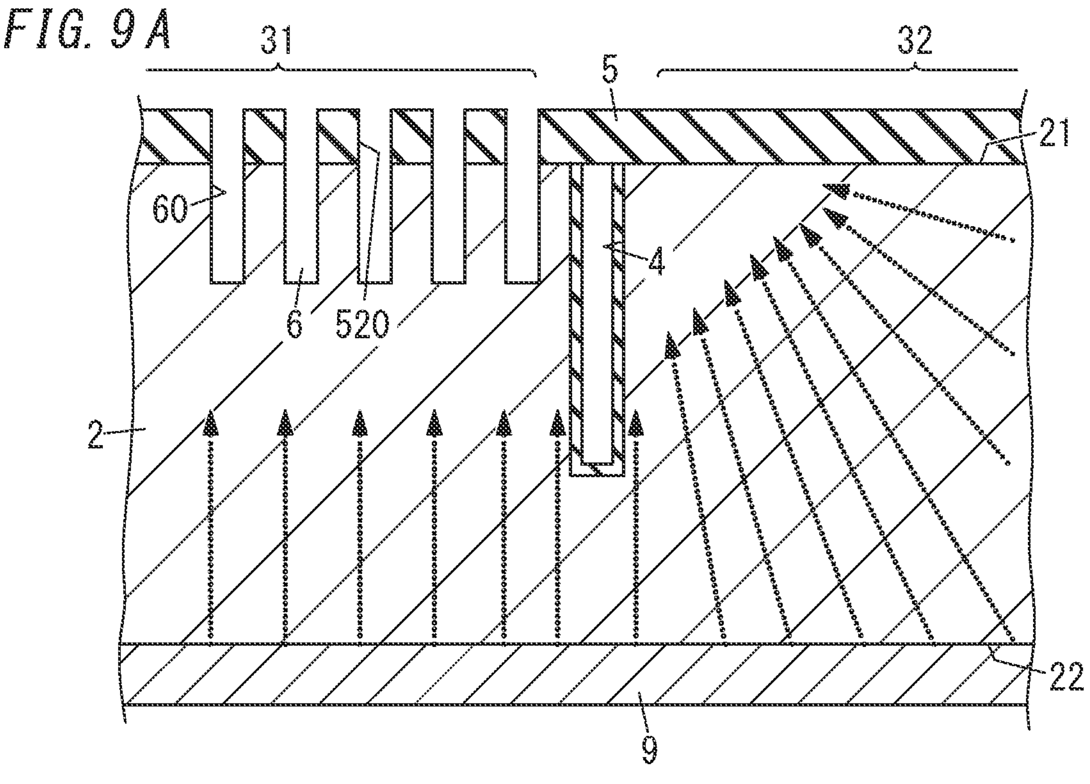
FIG. 9A is a view explaining operation of the groove for the first embodiment when an anodic oxidation process is performed.

In contrast, the present embodiment has a groove 4 formed at a boundary between a capacitance generation region 31 and a non-capacitance generation region 32 as shown in FIG. 9A. The groove 4 is recessed from a first surface 21 toward a second surface 22 of a silicon substrate 2. Providing the groove 4 can block an electric field directed from the non-capacitance generation region 32 of the second surface 22 toward the capacitance generation region 31 of the first surface 21 when the anodic oxidation process is performed. As a result, a porous part 6 is mostly formed in the capacitance generation region 31 and is suppressed from being formed in the non-capacitance generation region 32. Note that in FIG. 9A, the first surface 21 of the silicon substrate 2 is covered with a masking layer 5. In the capacitance generation region 31, the masking layer 5 has a plurality of through holes 520 formed therein.

2. First Embodiment (Details)

(1) Capacitor

A capacitor 1 according to the present embodiment will be described below with reference to the drawings. For the sake of description of a positional relationship and the like, arrows indicating an X axis, a Y axis, and a Z axis included in a three-dimensional orthogonal coordinate system are shown in the drawings, but these arrows are intangible. In the following description, an XY plane view means a view along a Z-axis direction. The X-axis, Y-axis, and Z-axis directions are mere examples and are not intended to limit directions when the capacitor 1 is manufactured and in use. Moreover, an object (e.g., the capacitor 1) shown in a perspective view has a surface facing the viewer (surface in the positive direction of the X axis) and showing a cut surface.

Figure 1:
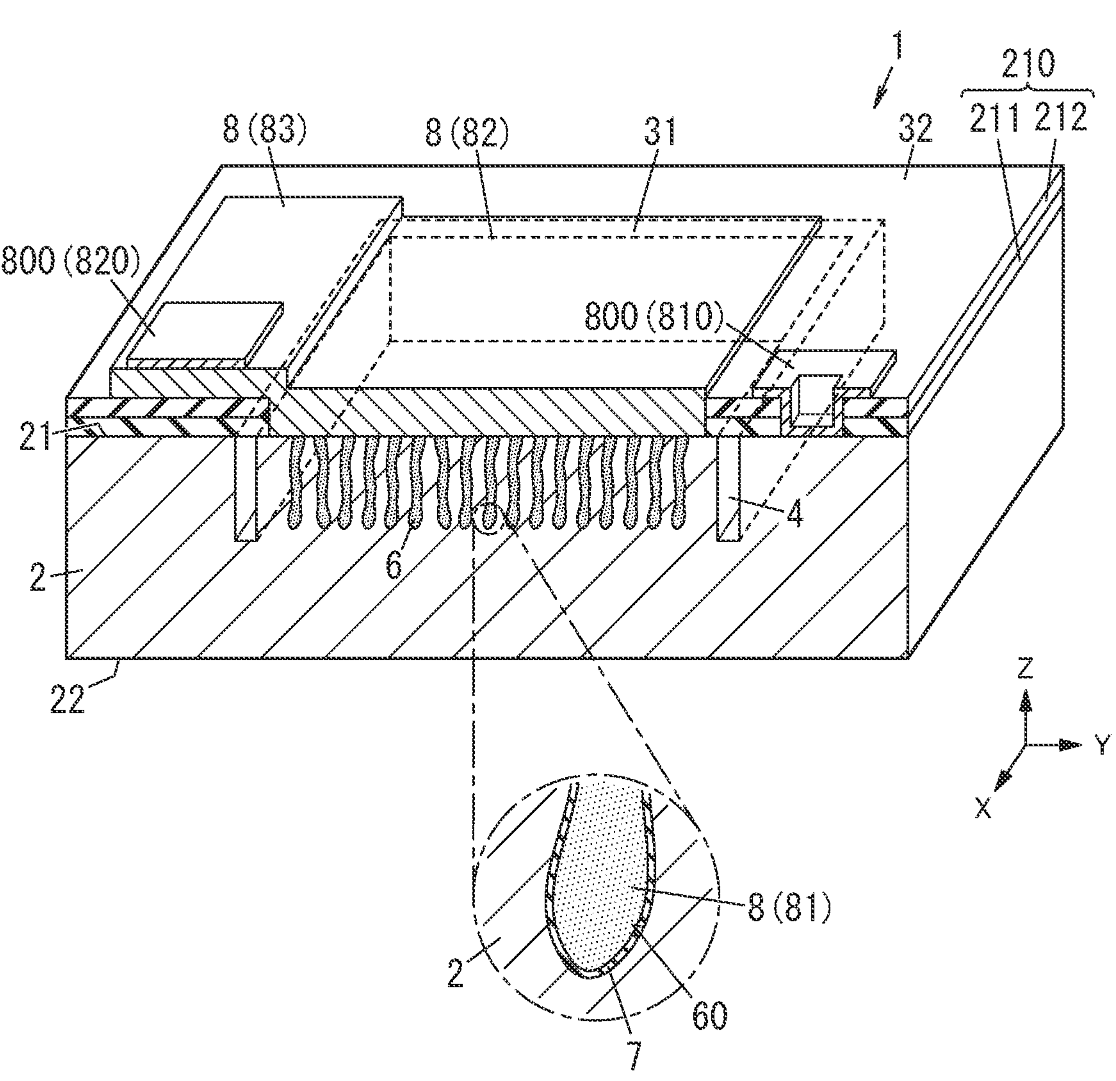
FIG. 1 is a schematic perspective view of a capacitor according to a first embodiment.

FIG. 1 shows the capacitor 1 according to the present embodiment. The capacitor 1 includes the silicon substrate 2, a dielectric layer 7, and a conductor layer 8. The capacitor 1 may further include an insulating layer 210 and a terminal 800.

<Silicon Substrate>

The silicon substrate 2 can constitute one electrode (first electrode) of the capacitor 1. The silicon substrate 2 is a p-type semiconductor in the present embodiment, but the silicon substrate 2 may be an n-type semiconductor. The p-type semiconductor is formed by adding a small amount of a trivalent element (e.g., boron, aluminum, gallium, and indium) to an intrinsic semiconductor of a tetravalent element (silicon). The n-type semiconductor is formed by adding a small amount of quinquevalent element (e.g., phosphorus, arsenic, and antimony) to an intrinsic semiconductor of a tetravalent element (silicon).

In the present embodiment, the silicon substrate 2 has a plate shape extending in the X-axis direction and the Y-axis direction. The shape of the silicon substrate 2 in the XY plane view is, but not particularly limited to being, rectangular. The thickness (length in the Z-axis direction) of the silicon substrate 2 is, for example, greater than or equal to 300 μm and less than or equal to 1000 μm but is not particularly limited to this example.

The silicon substrate 2 has the first surface 21 and the second surface 22. The first surface 21 is a surface facing the positive direction of the Z axis. The second surface 22 is opposite the first surface 21. That is, the second surface 22 is a surface facing in the negative direction of the Z axis.

The silicon substrate 2 includes the capacitance generation region 31 and the non-capacitance generation region 32 (see FIG. 1) when viewed along a direction (Z-axis direction) connecting the first surface 21 and the second surface 22. The capacitance generation region 31 is a region formed for the purpose of causing an electrostatic capacitance of the capacitor 1 to be generated. In the present embodiment, the shape of the capacitance generation region 31 in the XY plane view is, but not particularly limited to being, rectangular. The non-capacitance generation region 32 is a region other than the capacitance generation region 31. In the present embodiment, the non-capacitance generation region 32 surrounds the capacitance generation region 31 in the XY plane view.

The silicon substrate 2 has the groove 4. The groove 4 is provided at the boundary between the capacitance generation region 31 and the non-capacitance generation region 32. In the present embodiment, the groove 4 surrounds the capacitance generation region 31 in the XY plane view. The groove 4 is recessed from the first surface 21 toward the second surface 22 of the silicon substrate 2. The depth (length in the Z-axis direction) of the groove 4 is less than the thickness of the silicon substrate 2. The width (distance between inner side surfaces facing each other) of the groove 4 is not particularly limited.

The silicon substrate 2 has the porous part 6. The porous part 6 is in the capacitance generation region 31. The porous part 6 is surrounded by the groove 4 in the XY plane view. The porous part 6 extends from the first surface 21 of the silicon substrate 2 to a portion between the first surface 21 and the second surface 22. The depth of the porous part 6 is not particularly limited but is, for example, greater than or equal to 5 μm and less than or equal to 200 μm.

The porous part 6 has a plurality of fine pores 60. In the present embodiment, the plurality of fine pores 60 are aligned in a grid pattern in the XY plane view (see FIG. 3A). That is, the plurality of fine pores 60 are aligned at a constant pitch in the X-axis direction and the Y-axis direction. The fine pores 60 are non-through holes extending from the first surface 21 toward the second surface 22 of the silicon substrate 2. The fine pores 60 are open at the first surface 21 of the silicon substrate 2. The plurality of fine pores 60 are substantially parallel to the thickness direction (Z-axis direction) defined with respect to the silicon substrate 2. The depth of the porous part 6 is an average of the depths (lengths in the Z-axis direction) of the plurality of fine pores 60. The inner diameter of each fine pore 60 is not particularly limited but is, for example, greater than or equal to 0.5 μm and less than or equal to 5 μm.

<Insulating Layer>

The insulating layer 210 is an electrically insulating layer. The insulating layer 210 is formed in the non-capacitance generation region 32 of the first surface 21 of the silicon substrate 2. The insulating layer 210 may be a single layer or may include a plurality of layers. In the present embodiment, the insulating layer 210 includes a first insulating layer 211 and a second insulating layer 212. The first insulating layer 211 may include silicon oxide ($SiO_2$). The second insulating layer 212 may include silicon nitride ($Si_3N_4$).

The thickness of the insulating layer 210 is not particularly limited but is, for example, greater than or equal to 0.1 μm and less than or equal to 2.0 μm.

<Dielectric Layer>

The dielectric layer 7 is an electrically insulating layer and lies between the first electrode (mainly, the silicon substrate 2) and the second electrode (mainly, the conductor layer 8) of the capacitor 1. The dielectric layer 7 is formed on an inner surface of each of the fine pores 60 (see FIG. 1). Further, the dielectric layer 7 is formed in the capacitance generation region 31 of the first surface 21 of the silicon substrate 2. The thickness of the dielectric layer 7 is not particularly limited but is, for example, greater than or equal to 10 nm and less than or equal to 500 nm.

A material for the dielectric layer 7 is not particularly limited, but examples of the material include silicon oxide, titanium oxide, zirconium oxide, hafnium oxide, vanadium oxide, tungsten oxide, niobium oxide, tantalum oxide, and aluminum oxide. For example, oxidizing the inner surfaces of the fine pores 60 forms the dielectric layer 7 including the silicon oxide.

The dielectric layer 7 may be a single film or may include a plurality of films. The plurality of films are not particularly limited, but an example of the plurality of films is an Oxide/Nitride/Oxide film (ONO film). The ONO film includes a first silicon oxide layer, a silicon nitride layer, and a second silicon oxide layer. The first silicon oxide layer, the silicon nitride layer, and the second silicon oxide layer are stacked in this order, thereby forming the ONO film.

<Conductor Layer>

The conductor layer 8 is an electrically conductive layer and can be the other electrode (second electrode) of the capacitor 1. That is, the conductor layer 8 can be an electrode paired with the silicon substrate 2 in the capacitor 1. A material for the conductor layer 8 is not particularly limited, but examples of the material include polysilicon (polycrystalline silicon), platinum, and ruthenium.

The conductor layer 8 includes a first conductive part 81, a second conductive part 82, and a third conductive part 83 (see FIG. 1).

The first conductive part 81 is in contact with the dielectric layer 7. In the present embodiment, the first conductive part 81 is filled, on the dielectric layer 7, in the fine pores 60. The first conductive part 81 is not in contact with the silicon substrate 2.

The second conductive part 82 is in the capacitance generation region 31 of the first surface 21 of the silicon substrate 2. In the present embodiment, the second conductive part 82 is formed, on the dielectric layer 7, in the capacitance generation region 31 of the first surface 21 of the silicon substrate 2. The second conductive part 82 covers the dielectric layer 7 on the porous part 6. The second conductive part 82 is also not in contact with the silicon substrate 2. The second conductive part 82 is electrically connected to the first conductive part 81. The thickness (length in the Z-axis direction) of the second conductive part 82 is not particularly limited but is, for example, greater than or equal to 1 μm and less than or equal to 20 μm.

The third conductive part 83 is in the non-capacitance generation region 32 of the first surface 21 of the silicon substrate 2. The third conductive part 83 is formed on the insulating layer 210 in the non-capacitance generation region 32 of the first surface 21 of the silicon substrate 2. The third conductive part 83 is also not in contact with the silicon substrate 2. The third conductive part 83 is electrically connected to the second conductive part 82. Thus, the third conductive part 83 is electrically connected via the second conductive part 82 to the first conductive part 81.

<Terminal>

The terminal 800 is an electrically conductive member. The terminal 800 includes a first terminal 810 and a second terminal 820.

The first terminal 810 is disposed on a surface (surface facing the positive direction of the Z axis) of the insulating layer 210 (in particular, the second insulating layer 212). Part of the first terminal 810 extends through the insulating layer 210 in the Z-axis direction and is electrically connected to the silicon substrate 2. The first terminal 810 is in ohmic contact with the silicon substrate 2. The thickness (length in the Z-axis direction) of the first terminal 810 is not particularly limited but is, for example, greater than or equal to 200 nm and less than or equal to 500 nm. Note that the thickness of the first terminal 810 is the thickness of a portion of the first terminal 810 on the surface of the insulating layer 210.

The second terminal 820 is disposed on a surface (surface facing the positive direction of the Z axis) of the third conductive part 83. The second terminal 820 is electrically connected to the third conductive part 83. The second terminal 820 is in ohmic contact with the third conductive part 83. The thickness (length in the Z-axis direction) of the second terminal 820 is not particularly limited but is, for example, greater than or equal to 100 nm and less than or equal to 2000 nm.

(2) Method for Manufacturing Capacitor

(2.1) First Embodiment

Next, a method for manufacturing the capacitor 1 according to the first embodiment will be described with reference to the drawings. The method for manufacturing the capacitor 1 includes a groove forming step, a masking layer forming step, a porous part forming step, a dielectric layer forming step, and a conductor layer forming step. The method for manufacturing the capacitor 1 may further include a terminal forming step.

<Groove Forming Step>

Figures 2A, 2B, 2C, 2D:
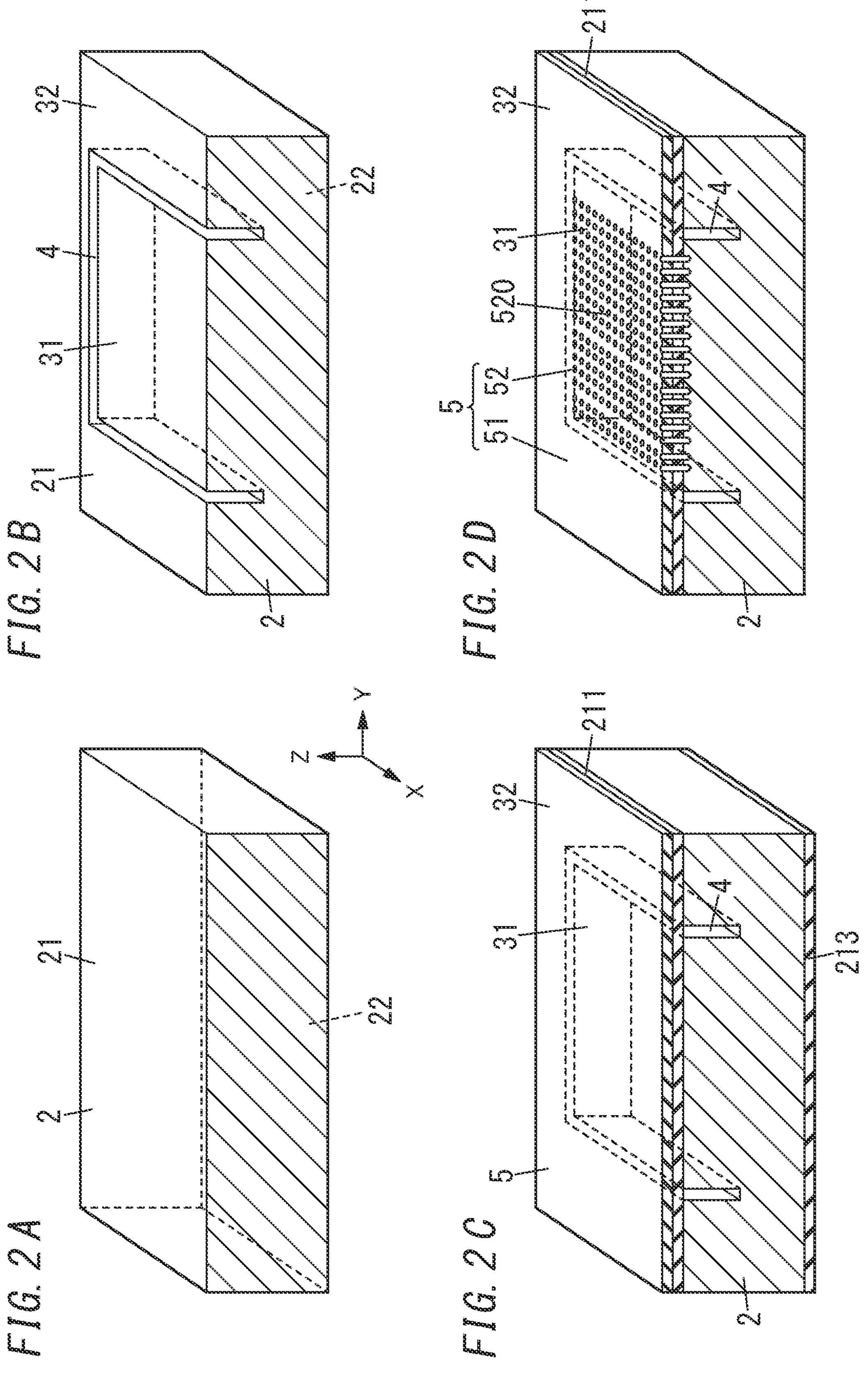
FIG. 2A to FIG. 2D are schematic perspective views of an example of a method for manufacturing the capacitor.

The groove forming step includes, first of all, preparing the silicon substrate 2 as shown in FIG. 2A. Then, as shown in FIG. 2B, the groove 4 is formed at the boundary between the capacitance generation region 31 and the non-capacitance generation region 32 of the silicon substrate 2. That is, the groove 4 surrounds the capacitance generation region 31 in the XY plane view. In the present embodiment, the groove 4 has a rectangular shape in the XY plane view. The groove 4 is recessed from the first surface 21 toward the second surface 22 of the silicon substrate 2. That is, the groove 4 is recessed in the negative direction of the Z axis.

A formation method of the groove 4 is not particularly limited, but examples of the formation method include dry etching and wet etching.

Examples of the dry etching include reactive ion etching (RIE). Of the reactive ion etching, deep RIE which enables (narrow and deep) etching with a high aspect ratio is preferable. Of the deep RIE, a Bosch process which enables etching with a particularly high aspect ratio is preferable.

The Bosch process is a process of repeating two processes, an etching step and a protection step. The etching step includes isotropic etching by using, mainly, sulfur hexafluoride ($SF_6$). The protection step includes protecting side walls by using a Teflon (registered trademark)-based gas ($C_4F_8$) to suppress the side walls from being laterally etched.

Examples of the wet etching include anisotropy etching. An anisotropy etching solution is not particularly limited, but examples of the anisotropy etching solution include a KOH aqueous solution and a tetramethylammonium hydroxide (TMAH) aqueous solution.

<Masking Layer Forming Step>

The masking layer forming step includes, first of all, forming the first insulating layer 211 on the first surface 21 of the silicon substrate 2 and forming a third insulating layer 213 on the second surface 22 of the silicon substrate 2 as shown in FIG. 2C. The first insulating layer 211 and the third insulating layer 213 can be formed by, for example, thermal oxidation treatment. The thermal oxidation treatment can be performed by heating, under an oxygen atmosphere, the silicon substrate 2 at a temperature higher than or equal to 1000° C. and lower than or equal to 1200° C. Thus, the first insulating layer 211 and the third insulating layer 213 are formed into layers including silicon oxide.

Then, the masking layer 5 is formed on the first surface 21 of the silicon substrate 2. In the present embodiment, as shown in FIG. 2C, the masking layer 5 is formed on the first insulating layer 211 on the first surface 21 of the silicon substrate 2. That is, the masking layer 5 is formed on a surface (surface facing the positive direction of the Z axis) of the first insulating layer 211. The masking layer 5 can be formed by, for example, a chemical vapor deposition (CVD) method. The chemical vapor deposition method is not particularly limited, but examples thereof include thermal CVD and plasma CVD. A material for the masking layer 5 is not particularly limited, but examples of the material include silicon nitride. In the present embodiment, the masking layer 5 is a layer including silicon nitride.

Then, as shown in FIG. 2D, the masking layer 5 is subjected to partial etching. The partial etching is performed on the masking layer 5 in the capacitance generation region 31 but is not performed on the masking layer 5 in the non-capacitance generation region 32. The partial etching may be, for example, but not particularly limited to, dry etching. Of the dry etching, plasma etching is preferable.

Of the masking layer 5, a portion which has not been partially etched is a first masking part 51. Of the masking layer 5, a portion which has been partially etched is a second masking part 52. Thus, the masking layer 5 includes the first masking part 51 and the second masking part 52 (see FIG. 2D).

The first masking part 51, together with the first insulating layer 211, covers the non-capacitance generation region 32 of the first surface 21 of the silicon substrate 2. The first masking part 51 eventually serves as the second insulating layer 212.

The second masking part 52 does not cover at least part of the capacitance generation region 31. In the present embodiment, the second masking part 52 has a plurality of through holes 520. The plurality of through holes 520 extend through the masking layer 5 and the first insulating layer 211 in the thickness direction (Z-axis direction). Thus, a portion which is part of the capacitance generation region 31 of the first surface 21 of the silicon substrate 2 and which has the through holes 520 is not covered and is exposed to the outside.

The plurality of through holes 520 are aligned in a grid pattern in the XY plane view (see FIG. 2D). That is, the plurality of through holes 520 are aligned at a constant pitch in the X-axis direction and the Y-axis direction. The second masking part 52 is eventually removed.

Figures 5A, 5B, 5C, 5D:
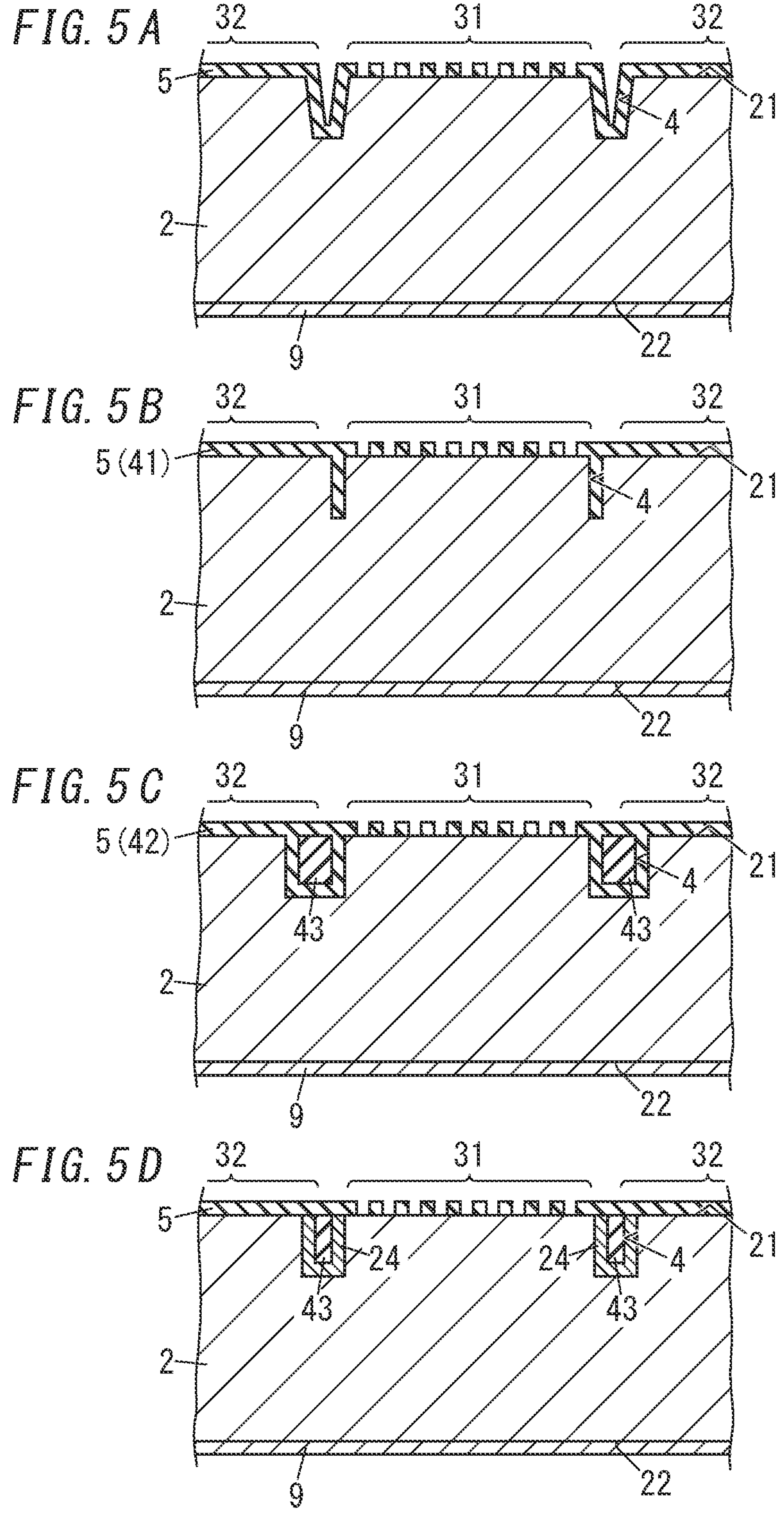
FIG. 5A to FIG. 5D are schematic sectional views of a variation of a groove.

Here, as shown in FIG. 5A, the masking layer 5 may be formed on an inner surface of the groove 4. The groove 4 does not have to be filled with the masking layer 5. Note that in FIG. 5A, the first insulating layer 211 is omitted.

<Porous Part Forming Step>

Figures 3A, 3B, 3C:
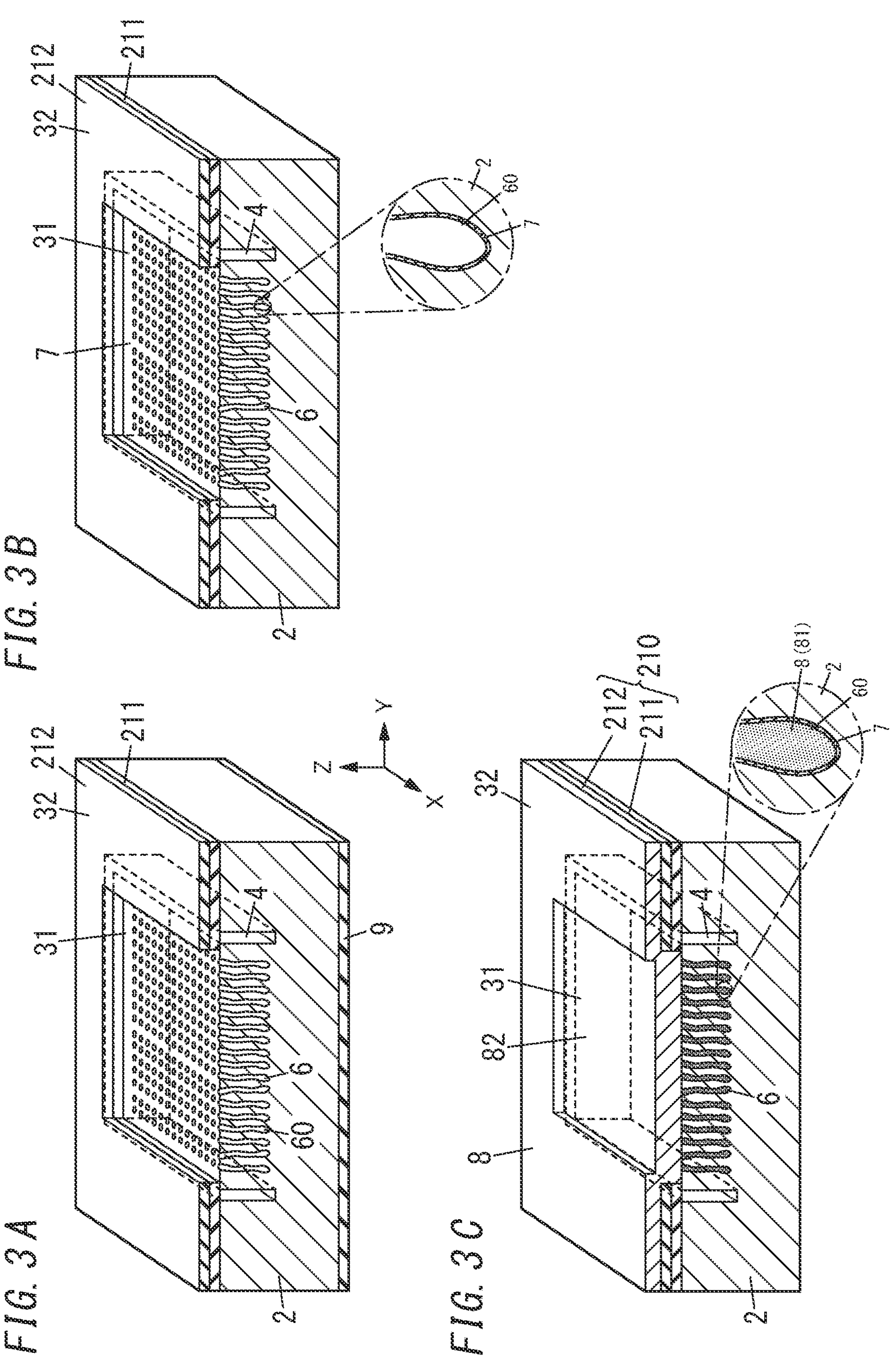
FIGS. 3A to 3C are schematic perspective views of an example of a method for manufacturing the capacitor.

The porous part forming step includes, first of all, forming a backside electrode 9 on the second surface 22 of the silicon substrate 2 as shown in FIG. 3A. The backside electrode 9 can be formed by, for example, a physical vapor deposition (PVD) method. The backside electrode 9 is electrically connected to the silicon substrate 2. The backside electrode 9 is in ohmic contact with the silicon substrate 2.

Then, the silicon substrate 2 is subjected to the anodic oxidation process. The anodic oxidation process may be performed by immersing the silicon substrate 2 and the platinum electrode (not shown) in an electrolytic solution and supplying electric power by using the backside electrode 9 of the silicon substrate 2 as the anode and the platinum electrode as the cathode. Thus, the porous part 6 is formed in the capacitance generation region 31 of the silicon substrate 2.

Here, the electrolytic solution may be, for example, but not limited to, hydrofluoric acid. The hydrofluoric acid may further include ethanol. Thus, hydrogen produced by anode oxidation is efficiently removed, thereby forming the porous part 6 having a further uniform structure.

In the present embodiment, the second masking part 52 has the plurality of through holes 520, and therefore, starting from the through holes 520, the fine pores 60 easily grow straight in the negative direction of the Z axis. The depth and the inner diameter of each fine pore 60 can be adjusted in accordance with conditions for the anodic oxidation process. The conditions for the anodic oxidation process are not particularly limited but are, for example, the specific resistance (electrical resistivity) of the silicon substrate 2, the composition of the electrolytic solution, and the current density.

As shown in FIG. 3A, the anodic oxidation process is followed by removal of the first insulating layer 211 and the second masking part 52 in the capacitance generation region 31 from the first surface 21 of the silicon substrate 2. This exposes the capacitance generation region 31 of the first surface 21 of the silicon substrate 2. That is, openings of the plurality of fine pores 60 are exposed. The backside electrode 9 is further removed from the second surface 22 of the silicon substrate 2.

<Dielectric Layer Forming Step>

The dielectric layer forming step includes forming the dielectric layer 7 on the inner surfaces of the fine pores 60 as shown in FIG. 3B. In the present embodiment, the dielectric layer 7 is further formed in the capacitance generation region 31 of the first surface 21 of the silicon substrate 2.

The dielectric layer 7 can be formed by, for example, the thermal oxidation treatment. The thermal oxidation treatment can be performed by heating, under an oxygen atmosphere, the silicon substrate 2 having the porous part 6 at a temperature higher than or equal to 800° C. and lower than or equal to 1200° C. Thus, the dielectric layer 7 is formed into a layer including silicon oxide. Note that the dielectric layer 7 may be formed by the chemical vapor deposition method.

<Conductor Layer Forming Step>

The conductor layer forming step includes forming the conductor layer 8 covering the first surface 21 of the silicon substrate 2 as shown in FIG. 3C. Specifically, in the capacitance generation region 31, the conductor layer 8 is formed on the dielectric layer 7 on the first surface 21 of the silicon substrate 2. Moreover, in the non-capacitance generation region 32, the conductor layer 8 is formed on the insulating layer 210 on the first surface 21 of the silicon substrate 2.

The conductor layer 8 can be formed by, for example, the chemical vapor deposition method. A material for the conductor layer 8 is not particularly limited, but examples of the material include polysilicon, platinum, and ruthenium.

Performing the chemical vapor deposition method causes the material for the conductor layer 8 to enter the fine pores 60 of the porous part 6 and to be deposited on the dielectric layer 7 formed on the inner surfaces of the fine pores 60, thereby forming the first conductive part 81. Thus, the first conductive part 81 comes into contact with the dielectric layer 7. In addition, in the capacitance generation region 31, the material for the conductor layer 8 is deposited on a surface (surface facing the positive direction of the Z axis) of the dielectric layer 7, thereby forming the second conductive part 82. Thus, the second conductive part 82 is provided in the capacitance generation region 31 of the first surface 21 of the silicon substrate 2. The second conductive part 82 is electrically connected to the first conductive part 81.

Next, the conductor layer 8 in the non-capacitance generation region 32 of the first surface 21 of the silicon substrate 2 is partially removed. The conductor layer 8 can be removed with, for example, a semiconductor laser. As shown in FIG. 4A, the conductor layer 8 remaining in the non-capacitance generation region 32 serves as the third conductive part 83. The third conductive part 83 is in contact with, and is electrically connected to, the second conductive part 82.

<Terminal Forming Step>

The terminal forming step includes, first of all, forming a hole 840 extending through the insulating layer 210 in the non-capacitance generation region 32 of the silicon substrate 2 as shown in FIG. 4B. The hole 840 has a bottom surface which is the first surface 21 of the silicon substrate 2. The hole 840 can be formed by, for example, partial etching.

Then, as shown in FIG. 4C, a metal layer 830 covering the first surface 21 of the silicon substrate 2 is formed. Specifically, in the capacitance generation region 31, the metal layer 830 is formed on the second conductive part 82 on the dielectric layer 7 provided on the first surface 21 of the silicon substrate 2. Moreover, in part of the non-capacitance generation region 32, the metal layer 830 is formed on an inner surface of the hole 840. Thus, the metal layer 830 comes into contact with the first surface 21 of the silicon substrate 2. In addition, in remaining part of the non-capacitance generation region 32, the metal layer 830 is formed on the insulating layer 210 on the first surface 21 of the silicon substrate 2. The metal layer 830 can be formed by, for example, the chemical vapor deposition method.

Thereafter, of the metal layer 830, a portion in contact with the silicon substrate 2 through the hole 840 and a portion in contact with the third conductive part 83 are left, and the other portions of the metal layer 830 are removed. The metal layer 830 may be removed with, for example, a semiconductor laser. The portion in contact with the silicon substrate 2 through the hole 840 serves as the first terminal 810. The portion in contact with the third conductive part 83 serves as the second terminal 820.

Through these steps described above, the capacitor 1 shown in FIG. 1 is manufactured.

<Operation and Advantages>

In the present embodiment, the groove 4 formed at the boundary between the capacitance generation region 31 and the non-capacitance generation region 32 as shown in FIG. 9A before the porous part forming step (specifically, the anodic oxidation process). The groove 4 is recessed from the first surface 21 toward the second surface 22 of the silicon substrate 2. Providing the groove 4 can block an electric field directed from the non-capacitance generation region 32 of the second surface 22 toward the capacitance generation region 31 of the first surface 21 when the anodic oxidation process is performed. As a result, the porous part 6 is mostly formed in the capacitance generation region 31 and is suppressed from being formed in the non-capacitance generation region 32. Note that dotted line arrows in FIG. 9A show the directions of the electric field. In FIG. 9A, the first insulating layer 211 is omitted.

In addition, in the present embodiment, the second masking part 52 of the masking layer 5 has the plurality of through holes 520 (see FIG. 2D), and therefore, starting from the through holes 520, the fine pores 60 easily grow straight from the first surface 21 toward the second surface 22. That is, the plurality of fine pores 60, which the porous part 6 has, are easily formed to be elongated along the thickness direction defined with respect to the silicon substrate 2. Thus, the tilted fine pores 69 as shown in FIG. 19 are less likely to be formed.

<Variations: Filling Step>

Variations of the method for manufacturing the capacitor 1 according to the first embodiment will be described with reference to the drawings. In the following variations, components similar to those in the first embodiment are denoted by the same reference signs as those in the first embodiment, and the detailed description thereof may be omitted. The method for manufacturing the capacitor 1 according to each of the following variations further includes a filling step in addition to the steps included in the method for manufacturing the capacitor 1 according to the first embodiment.

<<First Variation>>

A filling step of a first variation includes filling an insulative material 41 in a groove 4 as shown in FIG. 5B. The insulative material 41 may be, for example, but not particularly limited to, silicon oxide. The insulative material 41 may be a material for a masking layer 5. That is, the masking layer 5 may be filled in the groove 4.

A method for filling the insulative material 41 in the groove 4 is not particularly limited, but examples thereof include a method using thermal oxidation treatment and the chemical vapor deposition method. These methods will be described below.

FIGS. 7A to 7C show how the thermal oxidation treatment fills the groove 4 with the insulative material 41. That is, a silicon substrate 2 is prepared as shown in FIG. 7A. Then, as shown in FIG. 7B, the groove 4 is formed in the silicon substrate 2 by dry etching (e.g., reactive ion etching). Thereafter, as shown in FIG. 7C, the silicon substrate 2 is heated, under an oxygen atmosphere, at a temperature higher than or equal to 1000° C. and lower than or equal to 1200° C., thereby performing the thermal oxidation treatment. This fills the groove 4 with silicon oxide which is the insulative material 41. The method using the thermal oxidation treatment is particularly effective when the depth D1 of the groove 4 is shallow and the width W1 of the groove 4 is narrow.

Figure 8A:
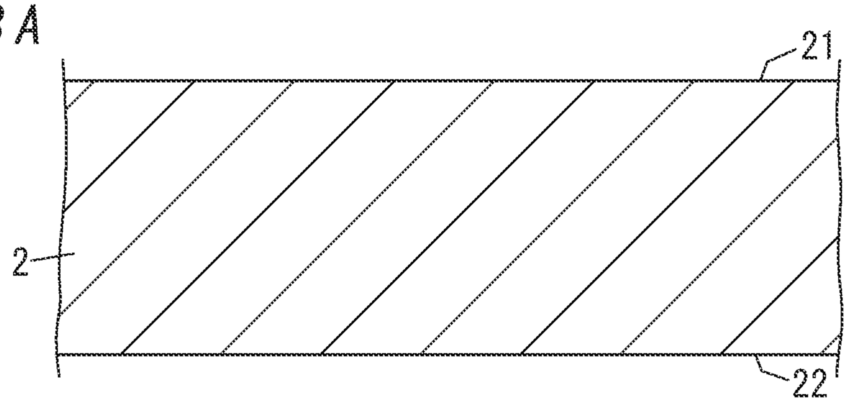
FIGS. 8A to 8C are schematic sectional views of an example of the formation method of the groove.
Figure 8B:
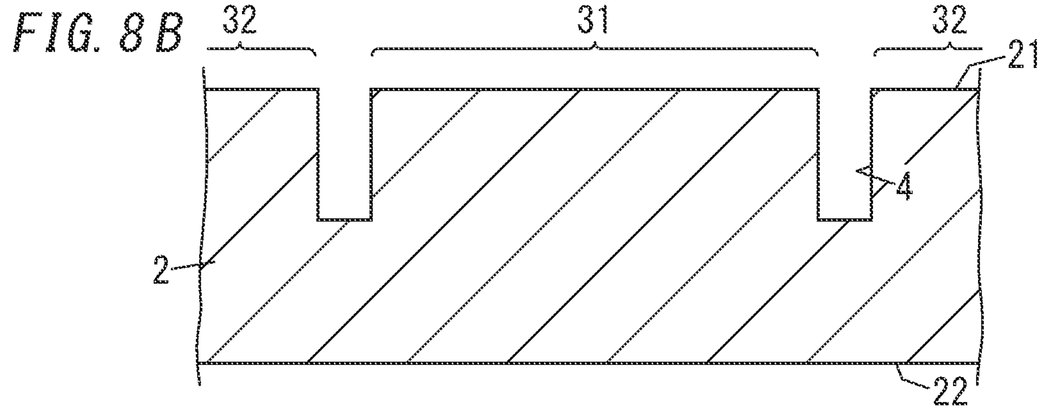
Figure 8C:
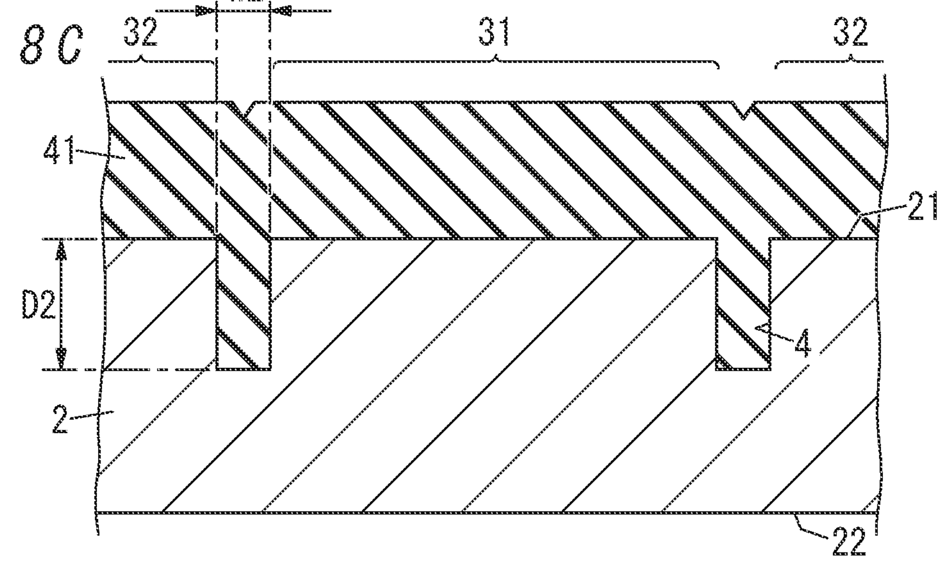

On the other hand, FIGS. 8A to 8C show how the chemical vapor deposition method fills a groove 4 with an insulative material 41. That is, a silicon substrate 2 is prepared as shown in FIG. 8A. Then, as shown in FIG. 8B, the groove 4 is formed in the silicon substrate 2 by dry etching (e.g., reactive ion etching). Then, as shown in FIG. 8C, chemical vapor deposition is performed on the silicon substrate 2 under a reduced-pressure atmosphere. This fills the groove 4 with the insulative material 41. The chemical vapor deposition is particularly effective when the depth D2 of the groove 4 is great and the width W2 of the groove 4 is great.

Thus, in the first variation, filling the groove 4 with the insulative material 41 improves the electric field blocking effect of the groove 4. As a result, a porous part 6 is further suppressed from being formed in a non-capacitance generation region 32.

<<Second Variation>>

A filling step of a second variation includes forming an insulating layer 42 on an inner surface of a groove 4 and filling a filler material 43 in the groove 4 provided with the insulating layer 42 as shown in FIG. 5C. A material for the insulating layer 42 is not particularly limited, but examples of the material include silicon oxide. The insulating layer 42 may be a masking layer 5. That is, the masking layer 5 may be formed on the inner surface of the groove 4. The filler material 43 may be a conductive material or may be an electrically insulating material. Thus, the filler material 43 may be, for example, but not particularly limited to, polysilicon. In the second variation, for example, a method using thermal oxidation treatment and the chemical vapor deposition method are used in combination.

FIGS. 6A to 6E show the filling step of the second variation. First of all, a silicon substrate 2 is prepared as shown in FIG. 6A. Then, as shown in FIG. 6B, the groove 4 is formed in the silicon substrate 2 by dry etching (e.g., reactive ion etching). Then, as shown in FIG. 6C, the silicon substrate 2 is heated, under an oxygen atmosphere, at a temperature higher than or equal to 1000° C. and lower than or equal to 1200° C., thereby performing the thermal oxidation treatment. This forms silicon oxide as the insulating layer 42 on the inner surface of the groove 4. A void remains in the groove 4. Then, as shown in FIG. 6D, chemical vapor deposition is performed on the silicon substrate 2 under a reduced-pressure atmosphere. This fills the void in the groove 4 with the filler material 43. The filler material 43 is filled, on the insulating layer 42, in the groove 4, and thus, the filler material 43 does not come into contact with the groove 4 (i.e., the silicon substrate 2). Thus, the filler material 43 may be an electrically conductive material. Thereafter, as shown in FIG. 6E, the filler material 43 not filled in the groove 4 is removed.

According to the second variation, filling the groove 4 with the filler material 43 improves the electric field blocking effect of the groove 4. As a result, a porous part 6 is further suppressed from being formed in a non-capacitance generation region 32. Moreover, also when the groove 4 is deep, the chemical vapor deposition method easily fills the groove 4 with the filler material 43.

<<Third Variation>>

In a third variation, a silicon substrate 2 which is a p-type semiconductor is used. A filling step includes forming an n-type semiconductor layer 24 on an inner surface of a groove 4 and filling a filler material 43 in the groove 4 provided with the n-type semiconductor layer 24 as shown in FIG. 5D. The filler material 43 may be, for example, but not particularly limited to, polysilicon.

First of all, the groove 4 is formed in the silicon substrate 2 by dry etching (e.g., reactive ion etching). Then, the n-type semiconductor layer 24 is formed on the inner surface of the groove 4. Specifically, a phosphorus oxide film ($P_2O_5$) is formed on the inner surface of the groove 4, phosphorus is diffused from the phosphorus oxide film into the groove 4, and then, the phosphorus oxide film is removed by, for example, wet etching, thereby forming the n-type semiconductor layer 24 on the inner surface of the groove 4. A void remains in the groove 4. Thereafter, chemical vapor deposition is performed on the silicon substrate 2 under a reduced-pressure atmosphere. This fills the void in the groove 4 with the filler material 43. The filler material 43 is filled, on the n-type semiconductor layer 24, in the groove 4, and therefore, the filler material 43 does not come into contact with the groove 4 (i.e., the silicon substrate 2). Thus, the filler material 43 may be an electrically conductive material.

According to the third variation, filling the groove 4 with the filler material 43 improves the electric field blocking effect of the groove 4. As a result, a porous part 6 is further suppressed from being formed in a non-capacitance generation region 32. Moreover, also when the groove 4 is deep, the chemical vapor deposition method easily fills the groove 4 with the filler material 43.

(2.2) Second Embodiment

Next, a method for manufacturing a capacitor 1 according to a second embodiment will be described with reference to the drawings. In the second embodiment, components similar to those in the first embodiment are denoted by the same reference signs as those in the first embodiment, and the detailed description thereof may be omitted.

The method for manufacturing the capacitor 1 according to the present embodiment includes an n-type semiconductor part forming step, a masking layer forming step, a porous part forming step, a dielectric layer forming step, and a conductor layer forming step. The method for manufacturing the capacitor 1 may further include a terminal forming step.

The method for manufacturing the capacitor 1 according to the present embodiment is different from the method for manufacturing the capacitor 1 according to the first embodiment in that the method of the present embodiment includes an n-type semiconductor part forming step alternatively to the groove forming step. The masking layer forming step, the porous part forming step, the dielectric layer forming step, the conductor layer forming step, and the terminal forming step are similar to those in the first embodiment, and thus, the description thereof will be omitted.

<n-Type Semiconductor Part Forming Step>

The n-type semiconductor part forming step includes preparing a silicon substrate 2 which is a p-type semiconductor. Then, an n-type semiconductor part 25 is formed at a boundary between a capacitance generation region 31 and a non-capacitance generation region 32 of the silicon substrate 2 (see FIG. 9B). In the present embodiment, the n-type semiconductor part 25 surrounds the capacitance generation region 31 in the XY plane view.

The n-type semiconductor part 25 extends from a first surface 21 toward a second surface 22 of the silicon substrate 2. That is, the n-type semiconductor part 25 extends in the negative direction of the Z axis.

The n-type semiconductor part 25 has a part whose surface is flush with the first surface 21 of the silicon substrate 2. Surfaces of remaining parts of the n-type semiconductor part 25 are in contact with the silicon substrate 2. The surfaces of the remaining parts of the n-type semiconductor part 25 include a surface facing the capacitance generation region 31, a surface facing the non-capacitance generation region 32, and a surface facing the second surface 22. At a contact surface between the silicon substrate 2 and the n-type semiconductor part 25, a p-n junction is formed. That is, the p-n junction is formed at the contact surface between the silicon substrate 2 and the surfaces of the remaining parts of the n-type semiconductor part 25.

The n-type semiconductor part 25 can be formed by, for example, ion injection. That is, high-energy phosphorus ions are injected into the boundary between the capacitance generation region 31 and the non-capacitance generation region 32 of the silicon substrate 2, thereby forming the n-type semiconductor part 25.

<Operation and Advantages>

Figure 9B:
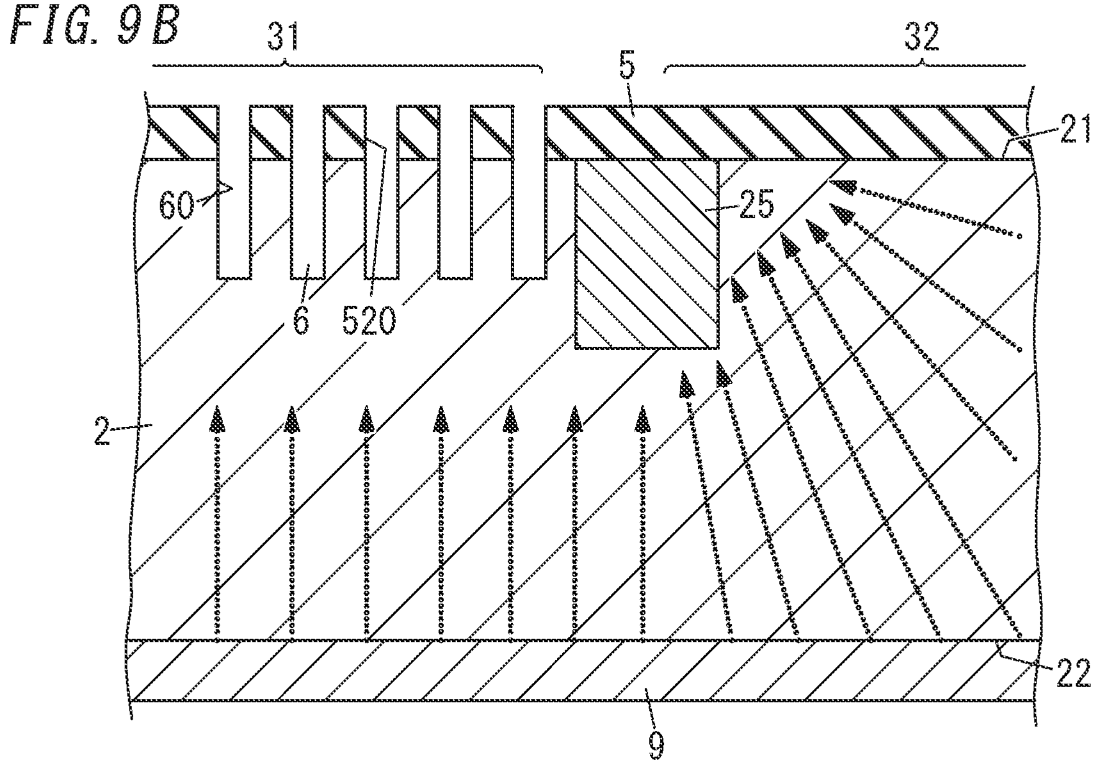
FIG. 9B is a view explaining operation of an n-type semiconductor part for a second embodiment when the anodic oxidation process is performed.

In the present embodiment, the n-type semiconductor part 25 is formed at the boundary between the capacitance generation region 31 and the non-capacitance generation region 32 as shown in FIG. 9B before the porous part forming step (specifically, the anodic oxidation process). The n-type semiconductor part 25 extends from the first surface 21 toward the second surface 22 of the silicon substrate 2. In addition, the n-type semiconductor part 25 forms the p-n junction with the silicon substrate 2 except for the surface flush with the first surface 21. Providing the n-type semiconductor part 25 having such a configuration can block an electric field directed from the non-capacitance generation region 32 of the second surface 22 toward the capacitance generation region 31 of the first surface 21 when the anodic oxidation process is performed. As a result, a porous part 6 is mostly formed in the capacitance generation region 31 and is suppressed from being formed in the non-capacitance generation region 32. Note that dotted line arrows in FIG. 9B show the directions of the electric field. In FIG. 9B, a first insulating layer 211 is omitted.

In addition, also in the present embodiment, a second masking part 52 of a masking layer 5 has a plurality of through holes 520 (see FIG. 2D), and therefore, starting from the through holes 520, fine pores 60 easily grow straight from the first surface 21 toward the second surface 22. That is, the plurality of fine pores 60, which the porous part 6 has, are easily formed to be elongated along the thickness direction defined with respect to the silicon substrate 2. Thus, the tilted fine pores 69 as shown in FIG. 19 are less likely to be formed.

3. Third Embodiment (Overview)

Figure 18:
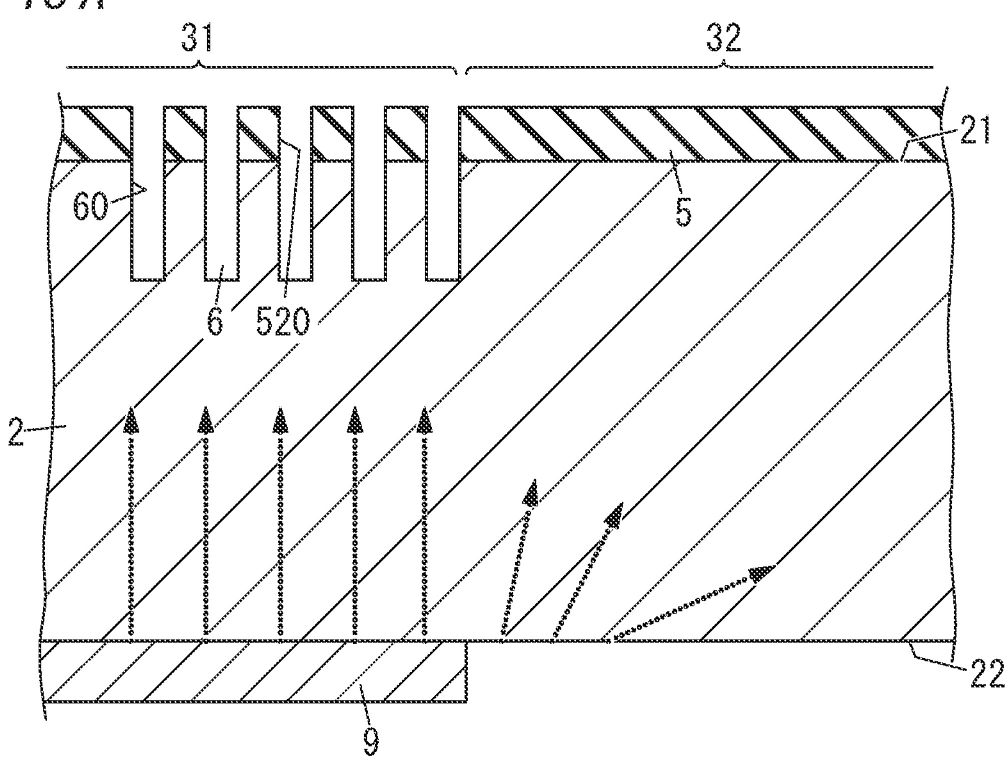
FIG. 18A is a view explaining operation of a backside electrode of the third embodiment when the anodic oxidation process is performed.
FIG. 18B is a view explaining operation of a low-resistance part of a fourth embodiment when the anodic oxidation process is performed.
Figure 18:
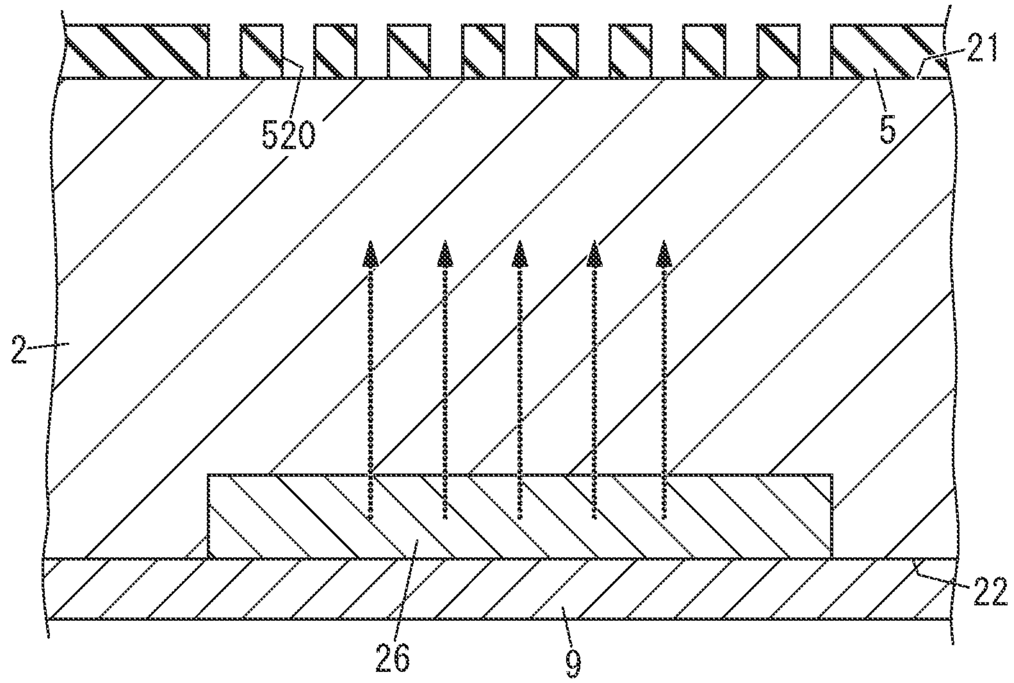

The present embodiment includes forming a backside electrode 9 having the same shape as a capacitance generation region 31 at the same location as the capacitance generation region 31 as shown in FIG. 18A. Performing the anodic oxidation process by using the backside electrode 9 as an anode makes an electric field directed from a second surface 22 toward a first surface 21 more concentrated in the capacitance generation region 31 than in a non-capacitance generation region 32. As a result, a porous part 6 is mostly formed in the capacitance generation region 31 and is suppressed from being formed in the non-capacitance generation region 32. Note that in FIG. 18A, the first surface 21 of a silicon substrate 2 is covered with a masking layer 5. In the capacitance generation region 31, the masking layer 5 has a plurality of through holes 520 formed therein.

4. Third Embodiment (Details)

(1) Capacitor

A capacitor 1 according to the present embodiment will be described below with reference to the drawings. Note that components similar to those in the first and second embodiments are denoted by the same reference signs as those in the first and second embodiment, and the detailed description thereof may be omitted.

Figure 10:
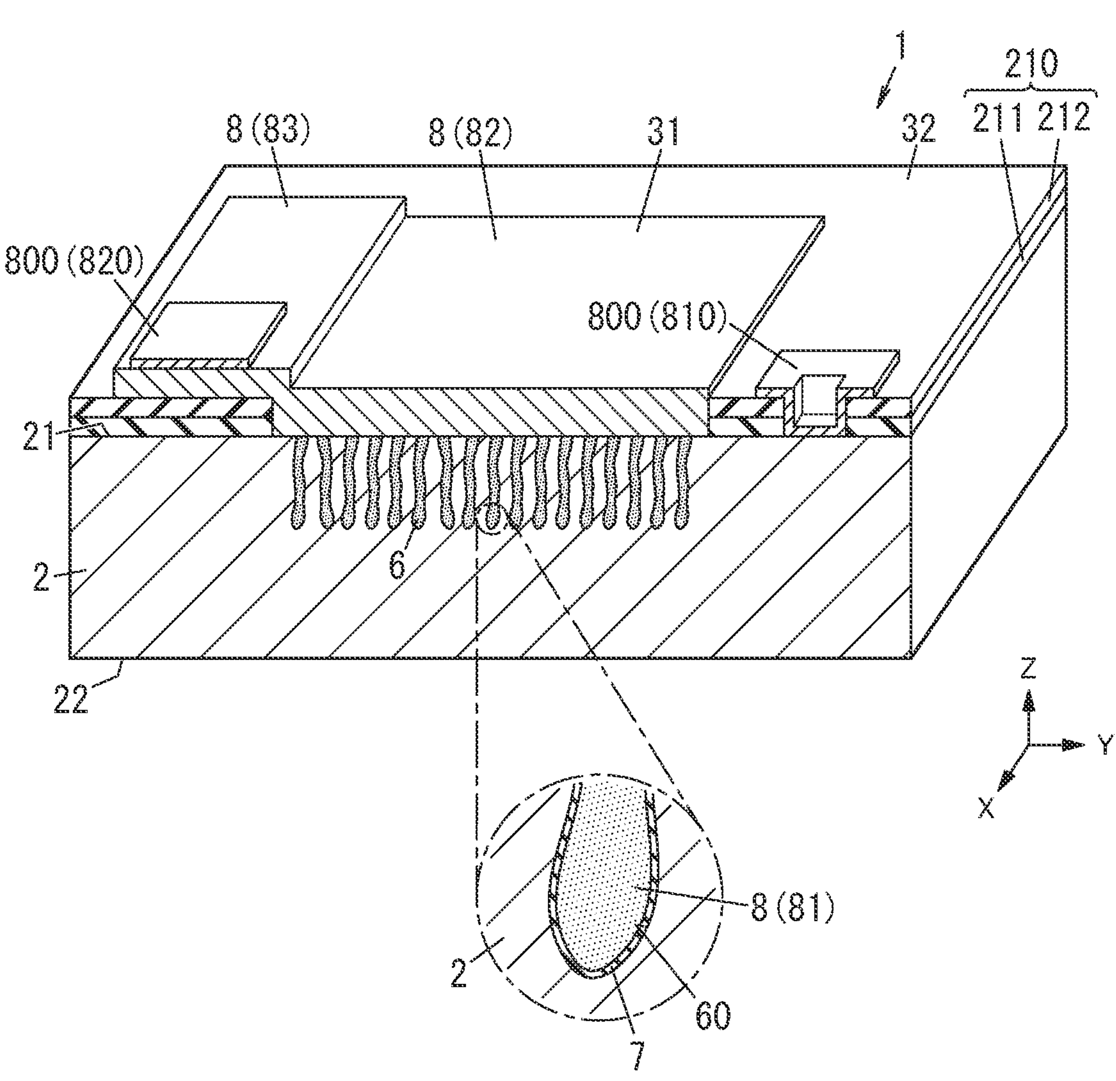
FIG. 10 is a schematic perspective view of a capacitor of a third embodiment.

FIG. 10 shows the capacitor 1 according to the present embodiment. The capacitor 1 includes the silicon substrate 2, a dielectric layer 7, and a conductor layer 8. The silicon substrate 2 of the present embodiment is different from the silicon substrate 2 of the first embodiment shown in FIG. 1 in that the silicon substrate 2 of the present embodiment has no groove 4. The capacitor 1 may further include an insulating layer 210 and a terminal 800.

(2) Method for Manufacturing Capacitor

(2.1) Third Embodiment

Next, a method for manufacturing the capacitor 1 according to the third embodiment will be described with reference to the drawings. The method for manufacturing the capacitor 1 includes a masking layer forming step, a porous part forming step, a dielectric layer forming step, and a conductor layer forming step. The method for manufacturing the capacitor 1 may further include a terminal forming step.

<Masking Layer Forming Step>

Figures 11A, 11B, 11C:
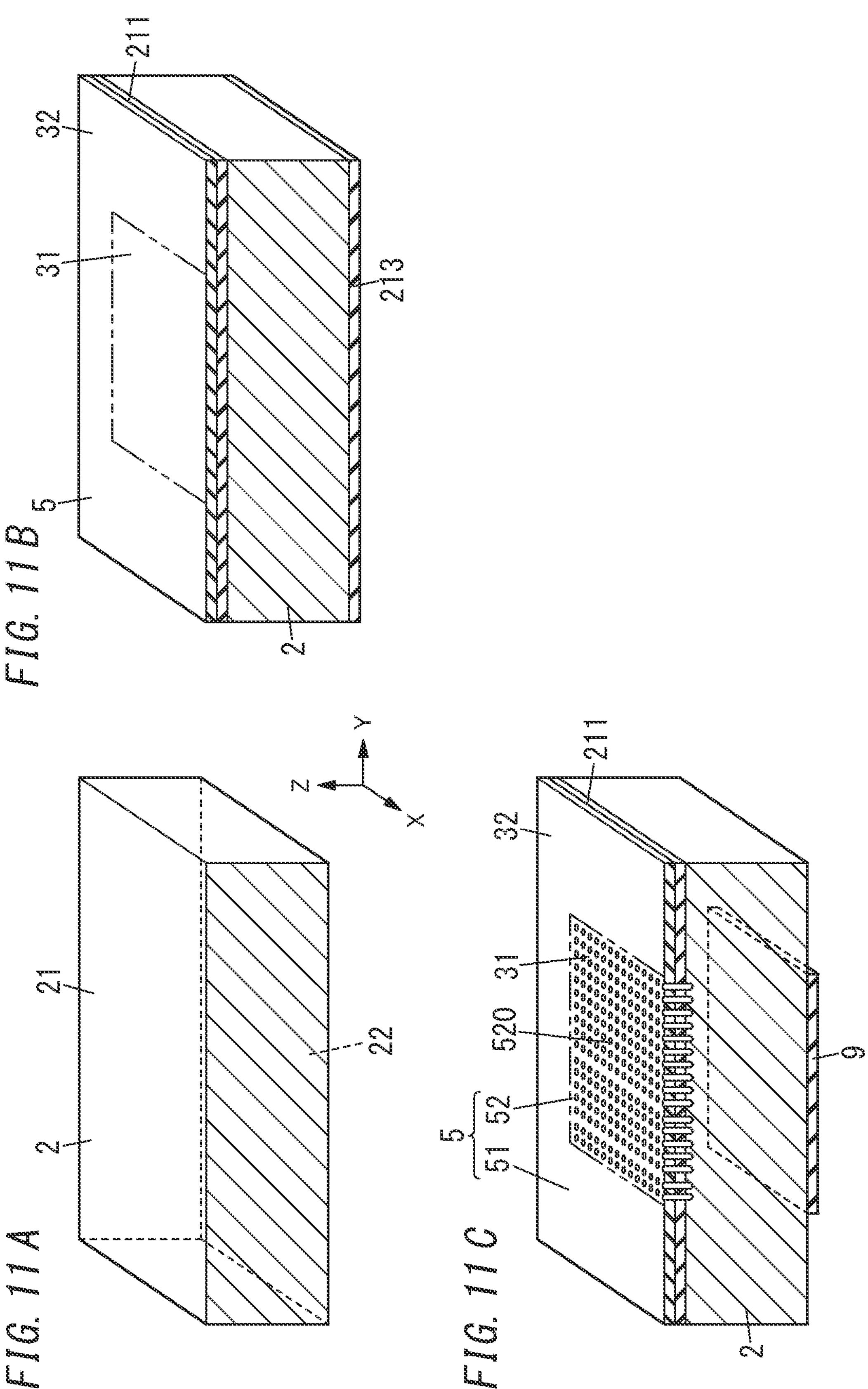
FIGS. 11A to 11C are schematic perspective views of an example of a method for manufacturing the capacitor of the third embodiment.

The masking layer forming step includes, first of all, preparing the silicon substrate 2 as shown in FIG. 11A. Then, a first insulating layer 211 is formed on the first surface 21 of the silicon substrate 2, and a third insulating layer 213 is formed on the second surface 22 of the silicon substrate 2 as shown in FIG. 11B. The first insulating layer 211 and the third insulating layer 213 can be formed by, for example, thermal oxidation treatment. The thermal oxidation treatment can be performed by heating, under an oxygen atmosphere, the silicon substrate 2 at a temperature higher than or equal to 1000° C. and lower than or equal to 1200° C. Thus, the first insulating layer 211 and the third insulating layer 213 are formed into layers including silicon oxide.

Then, the masking layer 5 is formed on the first surface 21 of the silicon substrate 2. In the present embodiment, the masking layer 5 is formed on the first insulating layer 211 on the first surface 21 of the silicon substrate 2 as shown in FIG. 11B. That is, the masking layer 5 is formed on a surface (surface facing the positive direction of the Z axis) of the first insulating layer 211. The masking layer 5 can be formed by, for example, a chemical vapor deposition (CVD) method. The chemical vapor deposition method is not particularly limited, but examples thereof include thermal CVD and plasma CVD. A material for the masking layer 5 is not particularly limited, but examples of the material include silicon nitride. In the present embodiment, the masking layer 5 is a layer including silicon nitride.

Then, as shown in FIG. 11C, the masking layer 5 is subjected to partial etching. The partial etching is performed on the masking layer 5 in the capacitance generation region 31 but is not performed on the masking layer 5 in the non-capacitance generation region 32. The partial etching may be, for example, but not particularly limited to, dry etching. Of the dry etching, plasma etching is preferable.

Of the masking layer 5, a portion which has not been partially etched is a first masking part 51. Of the masking layer 5, a portion which has been partially etched is a second masking part 52. Thus, the masking layer 5 includes the first masking part 51 and the second masking part 52 (see FIG. 11C).

The first masking part 51, together with the first insulating layer 211, covers the non-capacitance generation region 32 of the first surface 21 of the silicon substrate 2. The first masking part 51 eventually serves as a second insulating layer 212.

The second masking part 52 does not cover at least part of the capacitance generation region 31. In the present embodiment, the second masking part 52 has the plurality of through holes 520. The plurality of through holes 520 extend through the masking layer 5 and the first insulating layer 211 in the thickness direction (Z-axis direction). Thus, a portion which is part of the capacitance generation region 31 of the first surface 21 of the silicon substrate 2 and which has the through holes 520 is not covered and is exposed to the outside.

The plurality of through holes 520 are aligned in a grid pattern in the XY plane view (see FIG. 11C). That is, the plurality of through holes 520 are aligned at a constant pitch in the X-axis direction and the Y-axis direction. The second masking part 52 is eventually removed.

<Porous Part Forming Step>

The porous part forming step includes first of all, forming the backside electrode 9 on the second surface 22 of the silicon substrate 2 as shown in FIG. 11C. The shape of the backside electrode 9 is the same as the shape of the capacitance generation region 31 when viewed along a direction (Z-axis direction) connecting the first surface 21 and the second surface 22 of the silicon substrate 2. In the present embodiment, the capacitance generation region 31 has a rectangular shape in the XY plane view, and thus, the backside electrode 9 also has a rectangular shape. In the XY plane view, the size of the backside electrode 9 is equal to the size of the capacitance generation region 31.

In addition, the backside electrode 9 is formed at the same location as the capacitance generation region 31 on the second surface 22 of the silicon substrate 2. That is, in the XY plane view, the contour line of the backside electrode 9 coincides with the contour line of the capacitance generation region 31. In the present embodiment, the second surface 22 of the silicon substrate 2 is exposed outside except for a portion, where the backside electrode 9 is formed, of the second surface 22.

The backside electrode 9 can be formed by, for example, a physical vapor deposition (PVD) method. The backside electrode 9 is electrically connected to the silicon substrate 2. The backside electrode 9 is in ohmic contact with the silicon substrate 2.

Then, the silicon substrate 2 is subjected to the anodic oxidation process. The anodic oxidation process may be performed by immersing the silicon substrate 2 and a platinum electrode (not shown) in an electrolytic solution and supplying electric power by using the backside electrode 9 of the silicon substrate 2 as the anode and the platinum electrode as the cathode. Thus, the porous part 6 is formed in the capacitance generation region 31 of the silicon substrate 2.

Here, the electrolytic solution may be, for example, but not limited to, hydrofluoric acid. The hydrofluoric acid may further include ethanol. Thus, hydrogen produced by anode oxidation is efficiently removed, thereby forming the porous part 6 having a further uniform structure.

In the present embodiment, the second masking part 52 has the plurality of through holes 520, and therefore, starting from the through holes 520, fine pores 60 easily grow straight in the negative direction of the Z axis. The depth and the inner diameter of each fine pore 60 can be adjusted in accordance with conditions for the anodic oxidation process. The conditions for the anodic oxidation process are not particularly limited but are, for example, the specific resistance (electrical resistivity) of the silicon substrate 2, the composition of the electrolytic solution, and the current density.

Figures 12A, 12B, 12C:
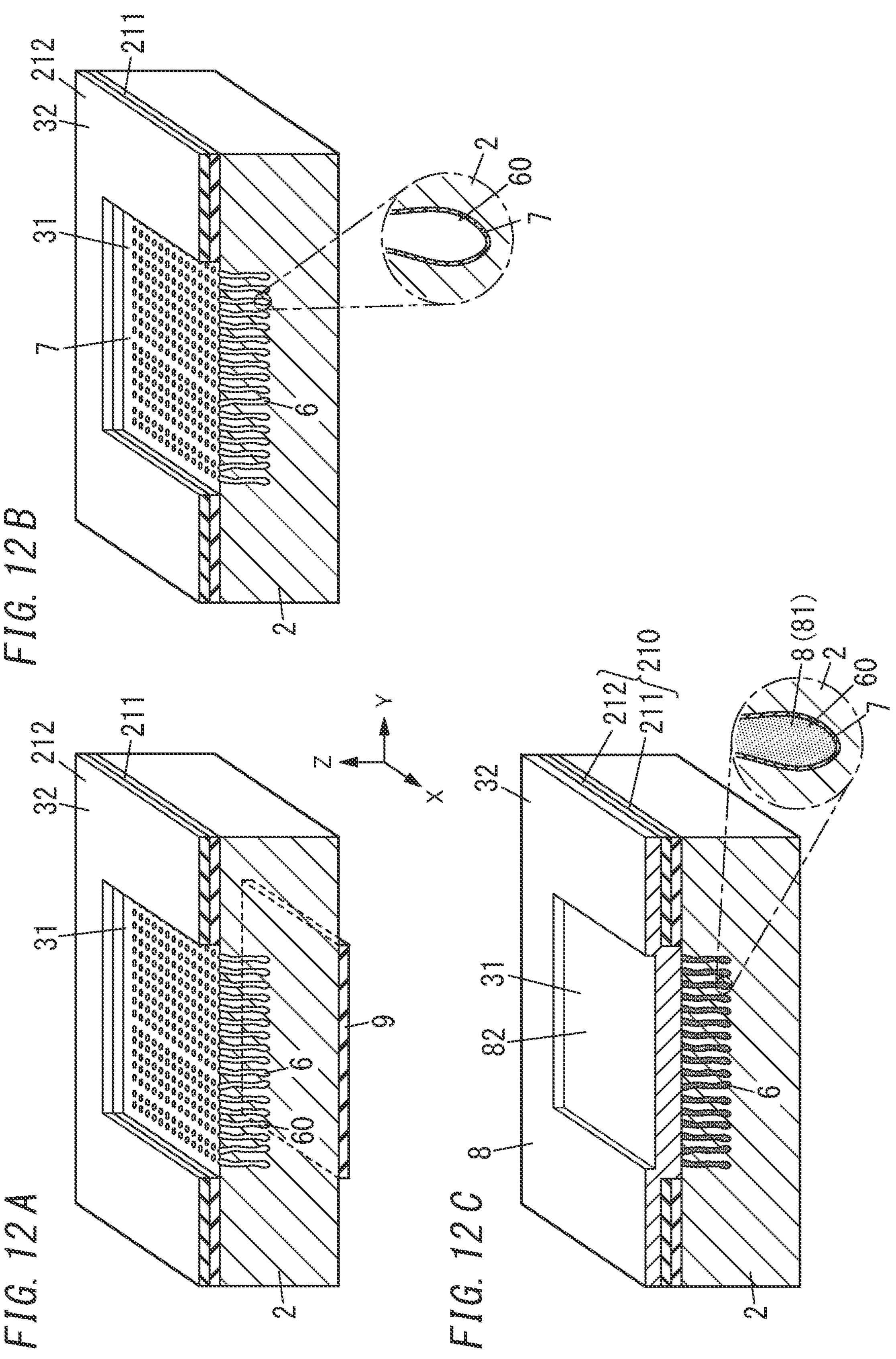
FIGS. 12A to 12C are schematic perspective views of an example of the method for manufacturing the capacitor of the third embodiment.

As shown in FIG. 12A, the anodic oxidation process is followed by removal of the first insulating layer 211 and the second masking part 52 in the capacitance generation region 31 from the first surface 21 of the silicon substrate 2. This exposes the capacitance generation region 31 of the first surface 21 of the silicon substrate 2. That is, openings of the plurality of fine pores 60 are exposed. The backside electrode 9 is further removed from the second surface 22 of the silicon substrate 2.

<Dielectric Layer Forming Step>

The dielectric layer forming step includes forming the dielectric layer 7 on inner surfaces of the fine pores 60 as shown in FIG. 12B. In the present embodiment, the dielectric layer 7 is further formed in the capacitance generation region 31 of the first surface 21 of the silicon substrate 2.

The dielectric layer 7 can be formed by, for example, the thermal oxidation treatment. The thermal oxidation treatment can be performed by heating, under an oxygen atmosphere, the silicon substrate 2 having the porous part 6 at a temperature higher than or equal to 800° C. and lower than or equal to 1200° C. Thus, the dielectric layer 7 is formed into a layer including silicon oxide. Note that the dielectric layer 7 may be formed by the chemical vapor deposition method.

<Conductor Layer Forming Step>

The conductor layer forming step includes forming the conductor layer 8 covering the first surface 21 of the silicon substrate 2 as shown in FIG. 12C. Specifically, in the capacitance generation region 31, the conductor layer 8 is formed on the dielectric layer 7 on the first surface 21 of the silicon substrate 2. Moreover, in the non-capacitance generation region 32, the conductor layer 8 is formed on the insulating layer 210 on the first surface 21 of the silicon substrate 2.

The conductor layer 8 can be formed by, for example, the chemical vapor deposition method. A material for the conductor layer 8 is not particularly limited, but examples of the material include polysilicon, platinum, and ruthenium.

Performing the chemical vapor deposition method causes the material for the conductor layer 8 to enter the fine pores 60 of the porous part 6 and to be deposited on the dielectric layer 7 formed on the inner surfaces of the fine pores 60, thereby forming the first conductive part 81. Thus, the first conductive part 81 comes into contact with the dielectric layer 7. In addition, in the capacitance generation region 31, the material for the conductor layer 8 is deposited on a surface (surface facing the positive direction of the Z axis)

of the dielectric layer 7, thereby forming a second conductive part 82. Thus, the second conductive part 82 is provided in the capacitance generation region 31 of the first surface 21 of the silicon substrate 2. The second conductive part 82 is electrically connected to the first conductive part 81.

Next, the conductor layer 8 in the non-capacitance generation region 32 of the first surface 21 of the silicon substrate 2 is partially removed. The conductor layer 8 can be removed with, for example, a semiconductor laser. As shown in FIG. 13A, the conductor layer 8 remaining in the non-capacitance generation region 32 serves as a third conductive part 83. The third conductive part 83 is in contact with, and is electrically connected to, the second conductive part 82.

<Terminal Forming Step>

The terminal forming step includes, first of all, forming a hole 840 extending through the insulating layer 210 in the non-capacitance generation region 32 of the silicon substrate 2 as shown in FIG. 13B. The hole 840 has a bottom surface which is the first surface 21 of the silicon substrate 2. The hole 840 can be formed by, for example, partial etching.

Then, as shown in FIG. 13C, a metal layer 830 covering the first surface 21 of the silicon substrate 2 is formed. Specifically, in the capacitance generation region 31, the metal layer 830 is formed on the second conductive part 82 on the dielectric layer 7 provided on the first surface 21 of the silicon substrate 2. Moreover, in part of the non-capacitance generation region 32, the metal layer 830 is formed on an inner surface of the hole 840. Thus, the metal layer 830 comes into contact with the first surface 21 of the silicon substrate 2. In addition, in remaining part of the non-capacitance generation region 32, the metal layer 830 is formed on the insulating layer 210 on the first surface 21 of the silicon substrate 2. The metal layer 830 can be formed by, for example, the chemical vapor deposition method.

Thereafter, of the metal layer 830, a portion in contact with the silicon substrate 2 through the hole 840 and a portion in contact with the third conductive part 83 are left, and the other portions of the metal layer 830 are removed. The metal layer 830 may be removed with, for example, a semiconductor laser. The portion in contact with the silicon substrate 2 through the hole 840 serves as a first terminal 810. The portion in contact with the third conductive part 83 serves as a second terminal 820.

Through these steps described above, the capacitor 1 shown in FIG. 10 is manufactured.

<Operation and Advantages>

The present embodiment includes forming the backside electrode 9 having the same shape as the capacitance generation region 31 at the same location as the capacitance generation region 31 as shown in FIG. 18A before the porous part forming step (specifically, the anodic oxidation process). Performing the anodic oxidation process by using the backside electrode 9 as the anode makes the electric field directed from the second surface 22 toward the first surface 21 more concentrated in the capacitance generation region 31 than in the non-capacitance generation region 32. As a result, the porous part 6 is mostly formed in the capacitance generation region 31 and is suppressed from being formed in the non-capacitance generation region 32. Note that dotted line arrows in FIG. 18A show the directions of the electric field. In FIG. 18A, the first insulating layer 211 is omitted.

In addition, in the present embodiment, the second masking part 52 of the masking layer 5 has the plurality of through holes 520 (see FIG. 11C), and therefore, starting from the through holes 520, the fine pores 60 easily grow straight from the first surface 21 toward the second surface 22. That is, the plurality of fine pores 60, which the porous part 6 has, are easily formed to be elongated along the thickness direction defined with respect to the silicon substrate 2. Thus, the tilted fine pores 69 as shown in FIG. 19 are less likely to be formed.

<Variations>

Variations of the method for manufacturing the capacitor 1 according to the third embodiment will be described with reference to the drawings. In the following variations, components similar to those in the third embodiment are denoted by the same reference signs as those in the third embodiment, and the detailed description thereof may be omitted.

<<First Variation>>

In a first variation, the method for manufacturing the capacitor 1 further includes an insulating layer forming step. The insulating layer forming step is a step before the anodic oxidation process in the porous part forming step.

Figure 14:
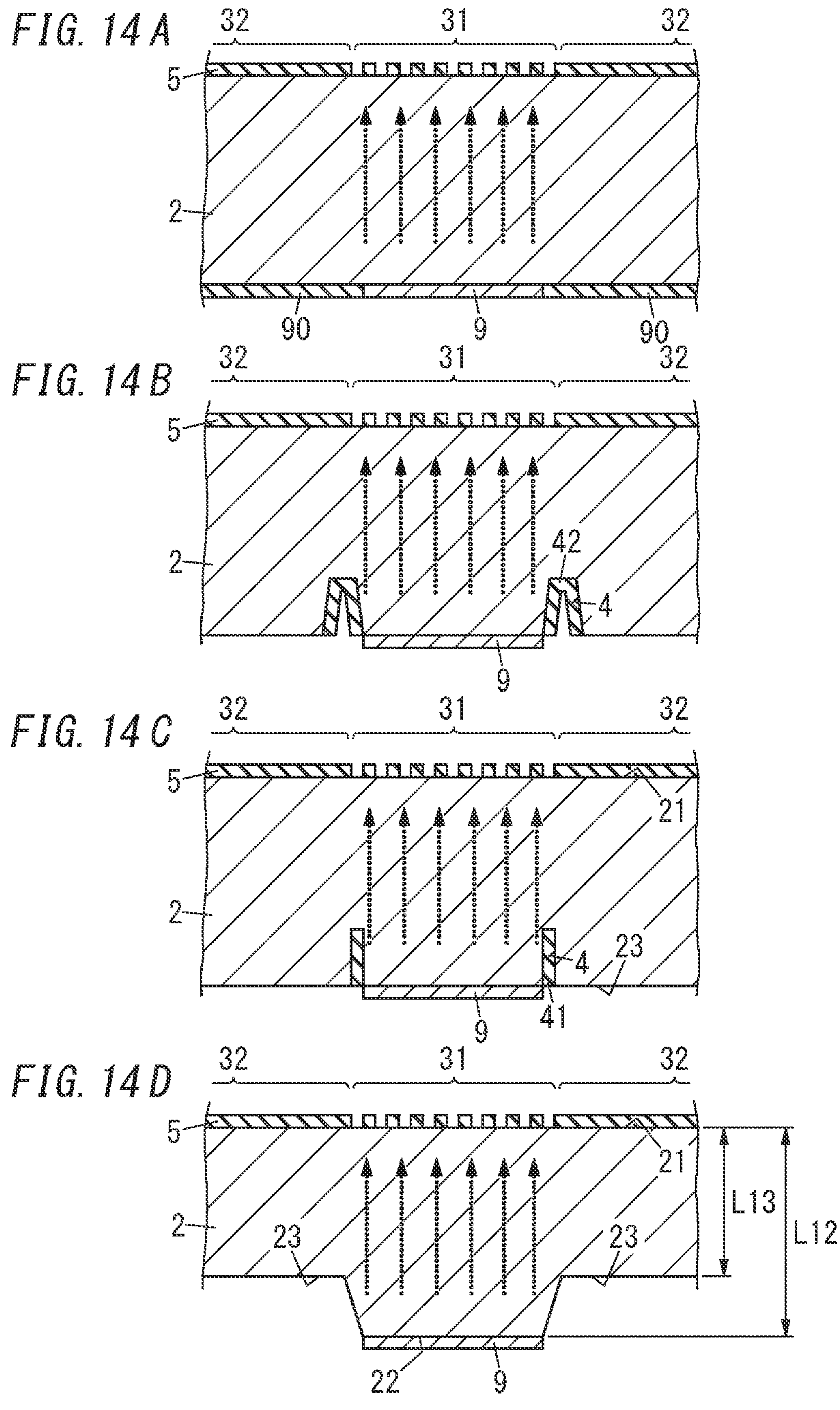
FIGS. 14A to 14D are schematic sectional views of a variation of the method for manufacturing the capacitor of the third embodiment.

The insulating layer forming step includes forming an insulating layer 90 on a second surface 22 of a silicon substrate 2 except for part of the second surface 22 on which a backside electrode 9 is provided as shown in FIG. 14A. The insulating layer 90 is an electrically insulating layer.

As explained above, the second surface 22 of the silicon substrate 2 is covered with the backside electrode 9 and the insulating layer 90. Specifically, a capacitance generation region 31 of the second surface 22 of the silicon substrate 2 is covered with the backside electrode 9. Moreover, a non-capacitance generation region 32 of the second surface 22 of the silicon substrate 2 is covered with the insulating layer 90. The insulating layer 90 can be formed by, for example, the thermal oxidation treatment or the chemical vapor deposition method.

According to the first variation, when the anodic oxidation process is performed, the insulating layer 90 suppresses a feeding tool to be brought into contact with the backside electrode 9 from coming into direct contact with the second surface 22 of the silicon substrate 2. Further, when the anodic oxidation process is performed, an electric field is less likely to be formed in the non-capacitance generation region 32.

<<Second Variation>>

In a second variation, the method for manufacturing the capacitor 1 further includes a groove forming step. The groove forming step includes forming a groove 4 around a backside electrode 9 as shown in FIG. 14B. That is, the groove 4 surrounds the backside electrode 9 in the XY plane view. In the present embodiment, the groove 4 has a rectangular shape in the XY plane view. The groove 4 is recessed from a second surface 22 toward a first surface 21 of a silicon substrate 2. That is, the groove 4 is recessed in the positive direction of the Z axis.

A formation method of the groove 4 is not particularly limited, but examples of the formation method include dry etching and wet etching.

Examples of the dry etching include reactive ion etching (RIE). Of the reactive ion etching, deep RIE which enables (narrow and deep) etching with a high aspect ratio is preferable. Of the deep RIE, a Bosch process which enables etching with a particularly high aspect ratio is preferable.

The Bosch process is a process of repeating two processes, an etching step and a protection step. The etching step includes isotropic etching by using, mainly, sulfur hexafluoride ($SF_6$). The protection step includes protecting side walls by using a Teflon (registered trademark)-based gas ($C_4F_8$) to suppress the side walls from being laterally etched.

Examples of the wet etching include anisotropy etching. An anisotropy etching solution is not particularly limited, but examples of the anisotropy etching solution include a KOH aqueous solution and a tetramethylammonium hydroxide (TMAH) aqueous solution.

According to the second variation, the groove 4 surrounds the backside electrode 9, and therefore, the groove 4 blocks an electric field directed from a capacitance generation region 31 of the second surface 22 toward a non-capacitance generation region 32 of the first surface 21. That is, the groove 4 suppresses the electric field from spreading from the capacitance generation region 31 to the non-capacitance generation region 32. Thus, the electric field directed from the second surface 22 toward the first surface 21 can be further concentrated in the capacitance generation region 31. As a result, a porous part 6 is further suppressed from being formed in the non-capacitance generation region 32.

<<Third Variation>>

In a third variation, the method for manufacturing the capacitor 1 further includes a filling step. The filling step includes filling a groove 4 with an insulative material 41 as shown in FIG. 14C. The insulative material 41 may be, for example, but not particularly limited to, silicon oxide.

A method for filling the insulative material 41 in the groove 4 is not particularly limited, but examples thereof include a method using thermal oxidation treatment and the chemical vapor deposition method. These methods will be described below.

Figure 16A:
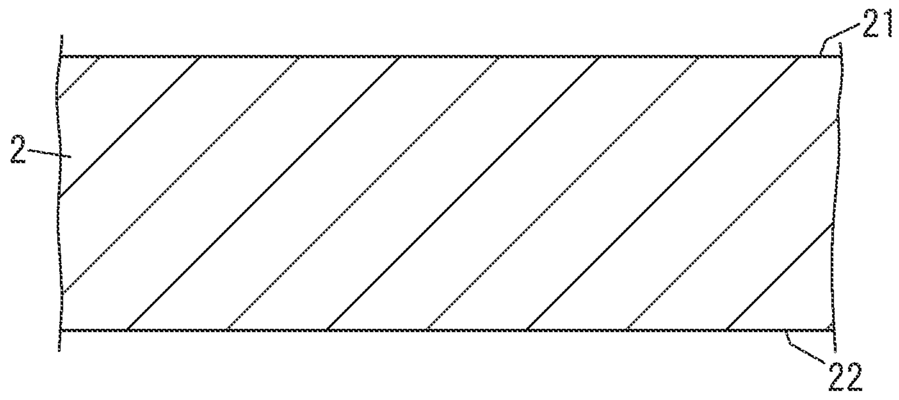
FIGS. 16A to 16C are schematic sectional views of an example of the formation method of the groove.
Figure 16B:
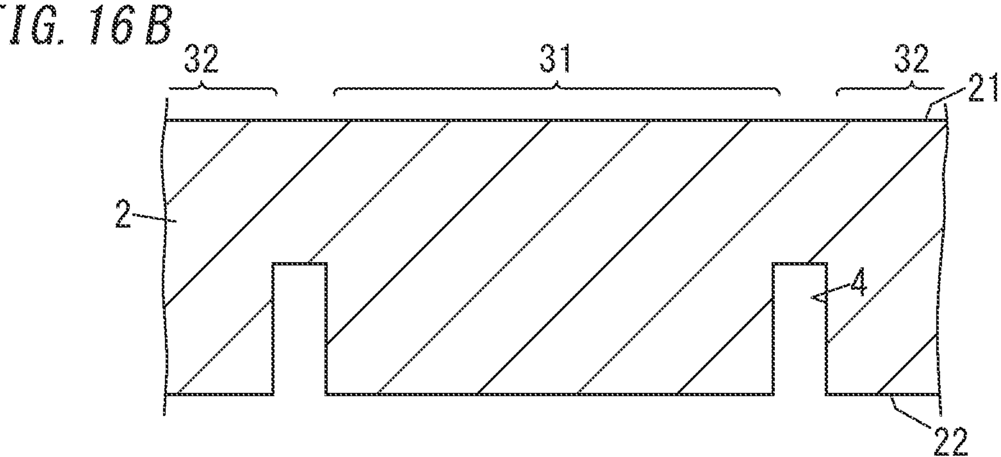
Figure 16C:
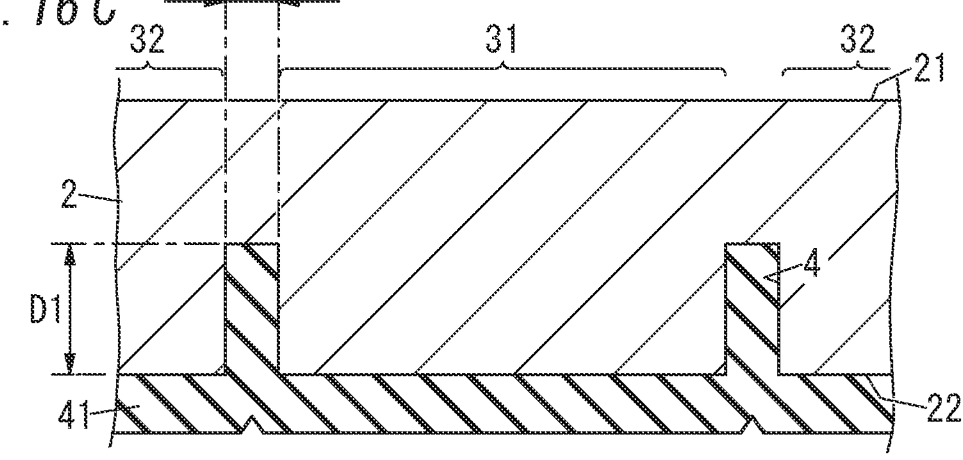

FIGS. 16A to 16C show how the thermal oxidation treatment fills the groove 4 with the insulative material 41. That is, a silicon substrate 2 is prepared as shown in FIG. 16A. Then, as shown in FIG. 16B, the groove 4 is formed in the silicon substrate 2 by dry etching (e.g., reactive ion etching). Then, as shown in FIG. 16C, the silicon substrate 2 is heated, under an oxygen atmosphere, at a temperature higher than or equal to 1000° C. and lower than or equal to 1200° C., thereby performing the thermal oxidation treatment. This fills the groove 4 with silicon oxide which is the insulative material 41. The method using the thermal oxidation treatment is particularly effective when the depth D1 of the groove 4 is shallow and the width W1 of the groove 4 is narrow.

Figure 17A:
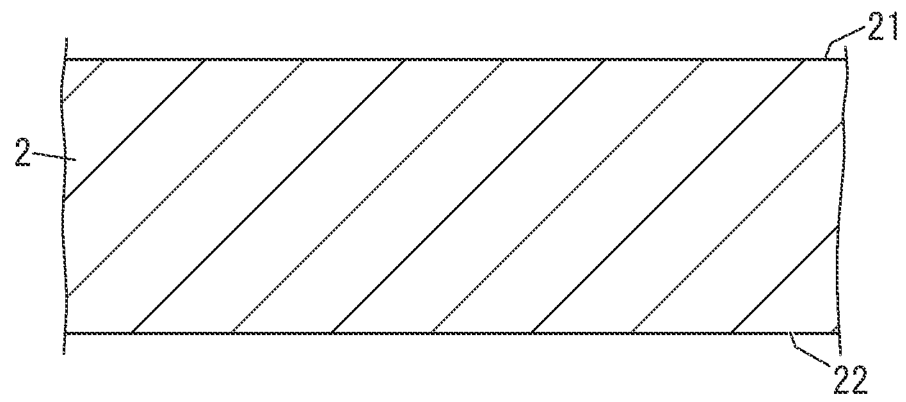
FIGS. 17A to 17C are schematic sectional views of an example of the formation method of the groove.
Figure 17B:
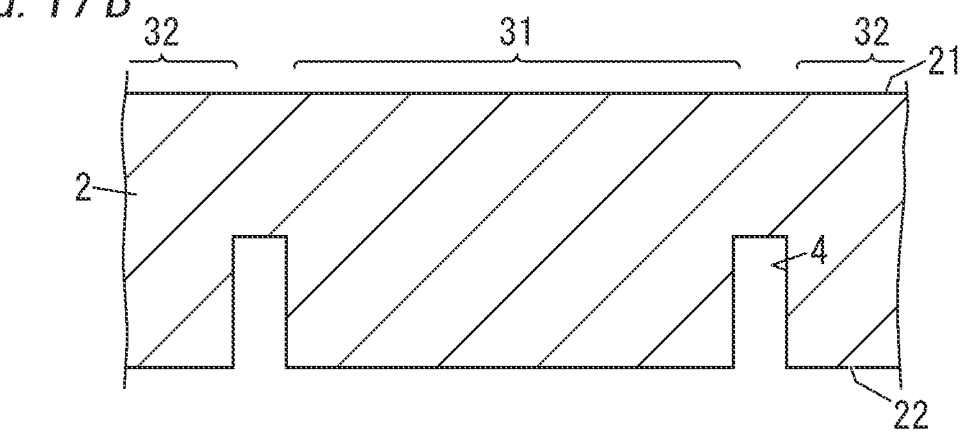
Figure 17C:
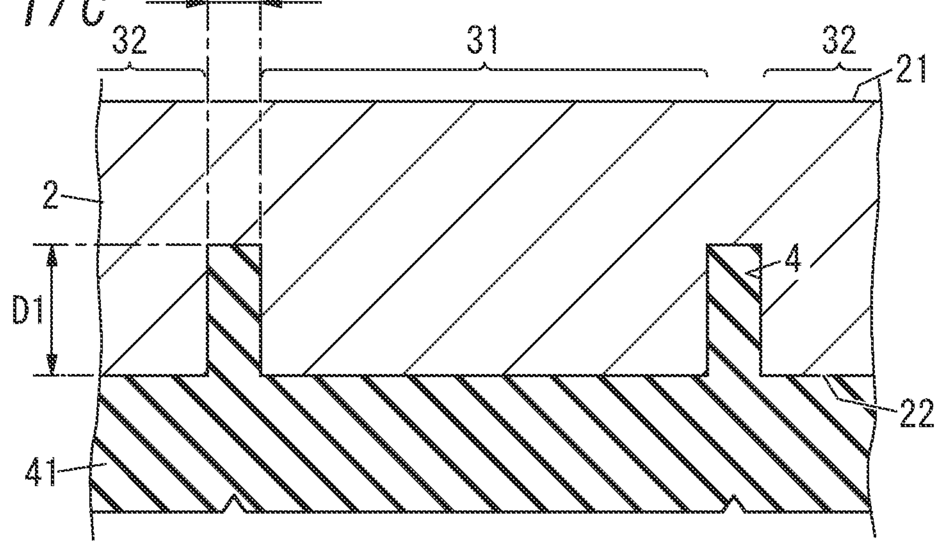

On the other hand, FIGS. 17A to 17C show how the chemical vapor deposition method fills a groove 4 with an insulative material 41. That is, a silicon substrate 2 is prepared as shown in FIG. 17A. Then, as shown in FIG. 17B, the groove 4 is formed in the silicon substrate 2 by dry etching (e.g., reactive ion etching). Then, as shown in FIG. 17C, chemical vapor deposition is performed on the silicon substrate 2 under a reduced-pressure atmosphere. This fills the groove 4 with the insulative material 41. The chemical vapor deposition is particularly effective when the depth D2 of the groove 4 is great and the width W2 of the groove 4 is great.

According to the third variation, filling the groove 4 with the insulative material 41 improves the electric field blocking effect of the groove 4. As a result, a porous part 6 is further suppressed from being formed in a non-capacitance generation region 32.

<<Fourth Variation>>

Figure 15:
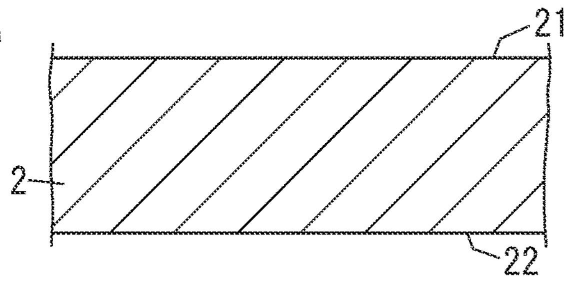
FIGS. 15A to 15E are schematic sectional views of an example of a formation method of a groove.
Figure 15:
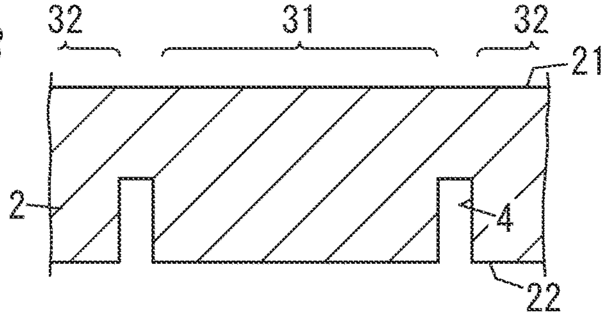
Figure 15:
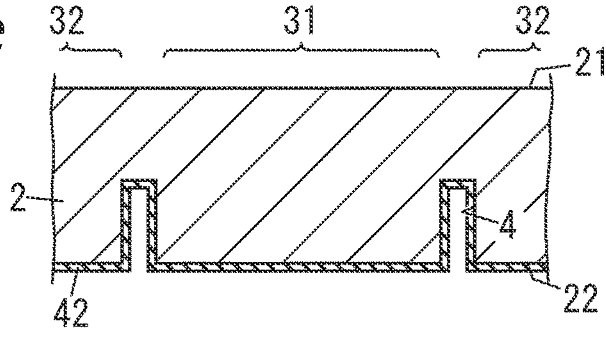
Figure 15:
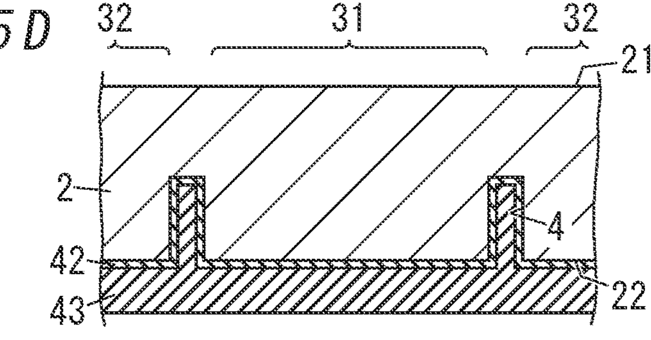
Figure 15:
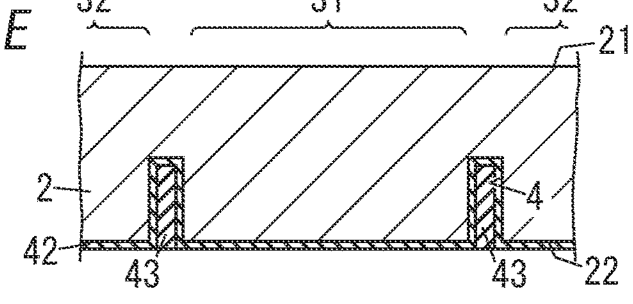

In a fourth variation, the method for manufacturing the capacitor 1 further includes a filling step similarly to the third variation. The filling step includes forming an insulating layer 42 on an inner surface of a groove 4 and filling a filler material 43 in the groove 4 provided with the insulating layer 42 as shown in FIG. 15E. A material for the insulating layer 42 is not particularly limited, but examples of the material include silicon oxide. The filler material 43 may be a conductive material or may be an electrically insulating material. Thus, the filler material 43 may be, for example, but not particularly limited to, polysilicon. In the fourth variation, for example, a method using thermal oxidation treatment and the chemical vapor deposition method are used in combination.

FIGS. 15A to 15E show the filling step of the fourth variation. First, a silicon substrate 2 is prepared as shown in FIG. 15A. Then, as shown in FIG. 15B, the groove 4 is formed in the silicon substrate 2 by dry etching (e.g., reactive ion etching). Then, as shown in FIG. 15C, the silicon substrate 2 is heated, under an oxygen atmosphere, at a temperature higher than or equal to 1000° C. and lower than or equal to 1200° C., thereby performing the thermal oxidation treatment. This forms silicon oxide as the insulating layer 42 on the inner surface of the groove 4. A void remains in the groove 4. Then, as shown in FIG. 15D, chemical vapor deposition is performed on the silicon substrate 2 under a reduced-pressure atmosphere. This fills the void in the groove 4 with the filler material 43. The filler material 43 is filled, on the insulating layer 42, in the groove 4, and thus, the filler material 43 does not come into contact with the groove 4. Thus, the filler material 43 may be an electrically conductive material. Thereafter, as shown in FIG. 15E, the filler material 43 not filled in the groove 4 is removed.

According to the fourth variation, filling the groove 4 with the filler material 43 improves the electric field blocking effect of the groove 4. As a result, a porous part 6 is further suppressed from being formed in a non-capacitance generation region 32. Moreover, also when the groove 4 is deep, the chemical vapor deposition method easily fills the groove 4 with the filler material 43.

<<Fifth Variation>>

A silicon substrate 2 in a fifth variation further has a third surface 23. The third surface 23 is opposite a first surface 21. That is, the third surface 23 is a surface facing in the negative direction of the Z axis.

The third surface 23 is present around a second surface 22 in the XY plane view. That is, the third surface 23 surrounds the second surface 22 on which a backside electrode 9 is formed in the XY plane view.

As shown in FIG. 14D, a distance L13 between the third surface 23 and the first surface 21 is shorter than a distance L12 between the second surface 22 provided with the backside electrode 9 and the first surface 21. That is, there is a step between the third surface 23 and the second surface 22 provided with the backside electrode 9.

According to the fifth variation, the step around the backside electrode 9 can suppress the electric field from spreading from a capacitance generation region 31 to a non-capacitance generation region 32. Thus, the electric field directed from the second surface 22 toward the first surface 21 can be further concentrated in the capacitance generation region 31. As a result, a porous part 6 is further suppressed from being formed in the non-capacitance generation region 32. Moreover, since there is the step, a feeding tool to be brought into contact with the backside electrode 9 is less likely to come into direct contact with the third surface 23 of the silicon substrate 2 when the anodic oxidation process is performed.

(2.2) Fourth Embodiment

Next, a method for manufacturing the capacitor 1 according to a fourth embodiment will be described with reference to the drawings. In the fourth embodiment, components similar to those in the third embodiment are denoted by the same reference signs as those in the third embodiment, and the detailed description thereof may be omitted.

The method for manufacturing the capacitor 1 according to the present embodiment includes a masking layer forming step, a low-resistance part forming step, a porous part forming step, a dielectric layer forming step, and a conductor layer forming step. The method for manufacturing the capacitor 1 may further include a terminal forming step.

The method for manufacturing the capacitor 1 according to the present embodiment is different from the method for manufacturing the capacitor 1 of the third embodiment in that the low-resistance part forming step is included. The masking layer forming step, the dielectric layer forming step, the conductor layer forming step, and the terminal forming step are similar to those in the third embodiment, and the description thereof is omitted.

<Low-Resistance Part Forming Step>

The low-resistance part forming step is a step before the porous part forming step (specifically, the anodic oxidation process). The low-resistance part forming step includes forming a low-resistance part 26 in a silicon substrate 2 as shown in FIG. 18B.

The low-resistance part 26 is a part having lower specific resistance (electrical resistivity) than the silicon substrate 2. The low-resistance part 26 can be formed by, for example, ion injection. Ions to be injected may be, for example, but not particularly limited to, boron ions. Note that a lattice defect caused due to the ion injection is removed by heat treatment.

The shape of the low-resistance part 26 is the same as the shape of a capacitance generation region 31 when viewed along a direction (Z-axis direction) connecting a first surface 21 and a second surface 22 of the silicon substrate 2. In the present embodiment, the capacitance generation region 31 has a rectangular shape in the XY plane view, and therefore, the low-resistance part 26 also has a rectangular shape. In the XY plane view, the size of a backside electrode 9 is equal to the size of the capacitance generation region 31.

The low-resistance part 26 extends from the second surface 22 toward the first surface 21 of the silicon substrate 2. That is, the low-resistance part 26 extends in the positive direction of the Z axis. The thickness (length in the Z-axis direction) of the low-resistance part 26 is less than the thickness of the silicon substrate 2.

The low-resistance part 26 is formed in the silicon substrate 2 at the same location as the capacitance generation region 31. That is, the contour line of the low-resistance part 26 coincides with the contour line of the capacitance generation region 31 in the XY plane view.

<Porous Part Forming Step>

The porous part forming step of the present embodiment is substantially the same as the porous part forming step of the third embodiment. The backside electrode 9 of the present embodiment preferably has the same shape, and is formed at the same location, as the capacitance generation region 31 similarly to the backside electrode 9 of the third embodiment. Note that the backside electrode 9 of the present embodiment may be formed on the entirety of the second surface 22 of the silicon substrate 2 (see FIG. 18B).

<Operation and Advantages>

The present embodiment includes forming the low-resistance part 26 having the same shape as the capacitance generation region 31 at the same location as the capacitance generation region 31 as shown in FIG. 18B before the porous part forming step (specifically, the anodic oxidation process). Providing the low-resistance part 26 having such a configuration can make the silicon substrate 2 itself have a difference in resistance. This can make an electric resistance between the first surface 21 and the second surface 22 in the capacitance generation region 31 lower than an electric resistance between the first surface 21 and the second surface 22 in a non-capacitance generation region 32. This makes an electric field directed from a second surface 22 toward a first surface 21 more concentrated in the capacitance generation region 31 than in a non-capacitance generation region 32. As a result, a porous part 6 is mostly formed in the capacitance generation region 31 and is suppressed from being formed in the non-capacitance generation region 32. Note that dotted line arrows in FIG. 18B show the directions of the electric field. In FIG. 18B, a first insulating layer 211 is omitted.

Note that in the present embodiment, the backside electrode 9 is formed on the entirety of the second surface 22 of the silicon substrate 2, but similarly to the low-resistance part 26, when the backside electrode 9 has the same shape, and is formed at the same location, as the capacitance generation region 31, the electric field directed from the second surface 22 toward the first surface 21 can be further concentrated.

In addition, also in the present embodiment, a second masking part 52 of a masking layer 5 has a plurality of through holes 520 (see FIG. 11C), and therefore, starting from the through holes 520, fine pores 60 easily grow straight from the first surface 21 toward the second surface 22. That is, the plurality of fine pores 60, which a porous part 6 has, are easily formed to be elongated along the thickness direction defined with respect to the silicon substrate 2. Thus, the tilted fine pores 69 as shown in FIG. 19 are less likely to be formed.

5. Variations

In the first and second embodiments, the porous part 6 is constituted by the plurality of fine pores 60 which are regularly arranged, but the arrangement of the plurality of fine pores 60 may be irregular. The plurality of fine pores 60 may have different shapes and different sizes.

In the first and second embodiments, the second masking part 52 does not cover part of the capacitance generation region 31 but does not have to cover the entirety of the capacitance generation region 31 (see, for example, FIG. 3A of Patent Literature 1). That is, before the anodic oxidation process, the entirety of the second masking part 52 does not have to be provided.

In the third and fourth embodiments, the porous part 6 is constituted by the plurality of fine pores 60 which are regularly arranged, but the arrangement of the plurality of fine pores 60 may be irregular. The plurality of fine pores 60 may have different shapes and different sizes.

In the third and fourth embodiments, the second masking part 52 does not cover part of the capacitance generation region 31 but does not have to cover the entirety of the capacitance generation region 31 (see, for example, FIG. 3A of Patent Literature 1). That is, before the anodic oxidation process, the entirety of the second masking part 52 does not have to be provided.

In the third embodiment, the backside electrode 9 and the capacitance generation region 31 have the same shape and the same size in the XY plane view but do not have to have exactly the same shapes and the same sizes as long as the effect of the third embodiment is not significantly impaired.

In the third embodiment, the backside electrode 9 and the capacitance generation region 31 are at the same location in XY plane view but may be shifted from each other in terms of their locations as long as the effect of the third embodiment is not significantly impaired.

In the fourth embodiment, the low-resistance part 26 and the capacitance generation region 31 have the same shapes and the same sizes in the XY plane view but may be different in terms of their shapes and sizes as long as the effect of the fourth embodiment is not significantly impaired.

In the fourth embodiment, the low-resistance part 26 and the capacitance generation region 31 is at the same location in the XY plane view but may be shifted from each other in terms of their locations as long as the effect of the fourth embodiment is not significantly impaired.

6. Aspects

As can be seen from the embodiments and variations described above, the present disclosure include aspects described below. In the following description, reference signs in parentheses are added only to clarify the correspondence relationship to the embodiment.

A first aspect is a method for manufacturing a capacitor (1), the method including a groove forming step, a masking layer forming step, a porous part forming step, a dielectric layer forming step, and a conductor layer forming step. The groove forming step includes preparing a silicon substrate (2) having a first surface (21) and a second surface (22) opposite the first surface (21). The silicon substrate (2) includes a capacitance generation region (31) and a non-capacitance generation region (32) which is a region other than the capacitance generation region (31) when viewed along a direction connecting the first surface (21) and the second surface (22). The groove forming step further includes forming a groove (4) at a boundary between the capacitance generation region (31) and the non-capacitance generation region (32). The groove (4) is recessed from the first surface (21) toward the second surface (22). The masking layer forming step includes forming a masking layer (5) on the first surface (21) of the silicon substrate (2). The masking layer (5) includes a first masking part (51) covering the non-capacitance generation region (32) and a second masking part (52) not covering at least part of the capacitance generation region (31). The porous part forming step includes forming a porous part (6) in the capacitance generation region (31) of the silicon substrate (2) by an anodic oxidation process. The porous part (6) has fine pores (60). The dielectric layer forming step includes forming a dielectric layer (7) on an inner surface of each of the fine pores (60). The conductor layer forming step includes forming a conductor layer (8) including a first conductive part (81) and a second conductive part (82) electrically connected to the first conductive part (81). The first conductive part (81) is in contact with the dielectric layer (7). The second conductive part (82) is in the capacitance generation region (31) of the first surface (21).

With this aspect, the porous part (6) is suppressed from being formed in the non-capacitance generation region (32).

A second aspect is a method for manufacturing the capacitor (1) of the first aspect. The second aspect further includes a filling step. The filling step includes filling an insulative material (41) in the groove (4).

With this aspect, the porous part (6) is further suppressed from being formed in the non-capacitance generation region (32).

A third aspect is a method for manufacturing the capacitor (1) of the first aspect. The third aspect further includes a filling step. The filling step includes forming an insulating layer (42) on an inner surface of the groove (4) and filling a filler material (43) in the groove (4) provided with the insulating layer (42).

With this aspect, the porous part (6) is further suppressed from being formed in the non-capacitance generation region (32). The groove (4) is easily deeply formed.

A fourth aspect is a method for manufacturing the capacitor (1) of the first aspect. The fourth aspect further includes a filling step. In the filling step, the silicon substrate (2) is a p-type semiconductor. The filling step includes forming an n-type semiconductor layer (24) on an inner surface of the groove (4) and filling a filler material (43) in the groove (4) provided with the n-type semiconductor layer (24).

With this aspect, the porous part (6) is further suppressed from being formed in the non-capacitance generation region (32). The groove (4) is easily deeply formed.

A fifth aspect is a method for manufacturing a capacitor (1), the method including an n-type semiconductor part forming step, a masking layer forming step, a porous part forming step, a dielectric layer forming step, and a conductor layer forming step. The n-type semiconductor part forming step includes preparing a silicon substrate (2) which is a p-type semiconductor. The silicon substrate (2) has a first surface (21) and a second surface (22) opposite the first surface (21). The silicon substrate (2) includes a capacitance generation region (31) and a non-capacitance generation region (32) which is a region other than the capacitance generation region (31) when viewed along a direction connecting the first surface (21) and the second surface (22). The n-type semiconductor part forming step further includes forming an n-type semiconductor part (25) at a boundary between the capacitance generation region (31) and the non-capacitance generation region (32). The n-type semiconductor part (25) extends from the first surface (21) toward the second surface (22). The masking layer forming step includes forming a masking layer (5) on the first surface (21) of the silicon substrate (2). The masking layer (5) includes a first masking part (51) covering the non-capacitance generation region (32) and a second masking part (52) not covering at least part of the capacitance generation region (31). The porous part forming step includes forming a porous part (6) in the capacitance generation region (31) of the silicon substrate (2) by an anodic oxidation process. The porous part (6) has fine pores (60). The dielectric layer forming step includes forming a dielectric layer (7) on an inner surface of each of the fine pores (60). The conductor layer forming step includes forming a conductor layer (8) including a first conductive part (81) and a second conductive part (82) electrically connected to the first conductive part (81). The first conductive part (81) is in contact with the dielectric layer (7). The second conductive part (82) is in the capacitance generation region (31) of the first surface (21).

With this aspect, the porous part (6) is suppressed from being formed in the non-capacitance generation region (32).

A sixth aspect is a method for manufacturing the capacitor (1) of any one of the first to fifth aspects. In the sixth aspect, the second masking part (52) has a plurality of through holes (520) extending through the second masking part (52) in a thickness direction defined with respect to the second masking part (52).

With this aspect, the fine pores (60) which the porous part (6) has are easily formed to be elongated along a thickness direction defined with respect to the silicon substrate (2).

A seventh aspect is a method for manufacturing a capacitor (1), the method including a masking layer forming step, a porous part forming step, a dielectric layer forming step, and a conductor layer forming step. The masking layer forming step includes preparing a silicon substrate (2) having a first surface (21) and a second surface (22) opposite the first surface (21). The silicon substrate (2) includes a capacitance generation region (31) and a non-capacitance generation region (32) which is a region other than the capacitance generation region (31) when viewed along a direction connecting the first surface (21) and the second surface (22). The masking layer forming step further includes forming a masking layer (5) on the first surface (21) of the silicon substrate (2). The masking layer (5) includes a first masking part (51) covering the non-capacitance generation region (32) and a second masking part (52) not covering at least part of the capacitance generation region (31). The porous part forming step includes forming a backside electrode (9) having a same shape as the capacitance generation region (31) at a same location as the capacitance generation region (31) on the second surface (22) of the silicon substrate (2) when viewed along the direction connecting the first surface (21) and the second surface (22). The porous part forming step further includes forming a porous part (6) in the capacitance generation region (31) of the silicon substrate (2) by an anodic oxidation process by using the backside electrode (9) as an anode. The porous part (6) has fine pores (60). The dielectric layer forming step includes forming a dielectric layer (7) on an inner surface of each of the fine pores (60). The conductor layer forming step includes forming a conductor layer (8) including a first conductive part (81) and a second conductive part (82) electrically connected to the first conductive part (81). The first conductive part (81) is in contact with the dielectric layer (7). The second conductive part (82) is in the capacitance generation region (31) of the first surface (21).

With this aspect, the porous part (6) is suppressed from being formed in the non-capacitance generation region (32).

An eighth aspect is a method for manufacturing the capacitor (1) of the seventh aspect. The eighth aspect further includes an insulating layer forming step. The insulating layer forming step includes forming an insulating layer (90) on the second surface (22) of the silicon substrate (2) except for part of the second surface on which the backside electrode (9) is provided.

With this aspect, when the anodic oxidation process is performed, a feeding tool to be brought into contact with the backside electrode (9) is suppressed by the insulating layer (90) from being brought into direct contact with the second surface (22) of the silicon substrate (2).

A ninth aspect is a method for manufacturing the capacitor (1) of the seventh or eighth aspect. The ninth aspect further includes a groove forming step. The groove forming step includes forming a groove (4) around the backside electrode (9). The groove (4) is recessed from the second surface (22) toward the first surface (21).

With this aspect, the porous part (6) is further suppressed from being formed in the non-capacitance generation region (32).

A tenth aspect is a method for manufacturing the capacitor (1) of the ninth aspect. The tenth aspect further includes a filling step. The filling step includes filling an insulative material (41) in the groove (4).

With this aspect, the porous part (6) is further suppressed from being formed in the non-capacitance generation region (32).

An eleventh aspect is a method for manufacturing the capacitor (1) of any one of the seventh to tenth aspects. In the eleventh aspect, the silicon substrate (2) further has a third surface (23) opposite the first surface (21). A distance (L13) between the third surface (23) and the first surface (21) is shorter than a distance (L12) between the second surface (22) on which the backside electrode (9) is formed and the first surface (21).

With this aspect, the porous part (6) is further suppressed from being formed in the non-capacitance generation region (32). Moreover, when the anodic oxidation process is performed, a feeding tool to be brought into contact with the backside electrode (9) is less likely to be brought into direct contact with the third surface (23) of the silicon substrate (2).

A twelfth aspect is a method for manufacturing a capacitor (1), the method including a masking layer forming step, a low-resistance part forming step, a porous part forming step, a dielectric layer forming step, and a conductor layer forming step. The masking layer forming step includes preparing a silicon substrate (2) having a first surface (21) and a second surface (22) opposite the first surface (21). The silicon substrate (2) includes a capacitance generation region (31) and a non-capacitance generation region (32) which is a region other than the capacitance generation region (31) when viewed along a direction connecting the first surface (21) and the second surface (22). The masking layer forming step further includes forming a masking layer (5) on the first surface (21) of the silicon substrate (2). The masking layer (5) includes a first masking part (51) covering the non-capacitance generation region (32) and a second masking part (52) not covering at least part of the capacitance generation region (31). The low-resistance part forming step includes forming a low-resistance part (26) having a same shape as the capacitance generation region (31) at a same location as the capacitance generation region (31) in the silicon substrate (2) when viewed along the direction connecting the first surface (21) and the second surface (22). The low-resistance part (26) has a lower specific resistance than the silicon substrate (2) and extends from the second surface (22) toward the first surface (21). The porous part forming step includes forming a porous part (6) in the capacitance generation region (31) of the silicon substrate (2) by an anodic oxidation process. The porous part (6) has fine pores (60). The dielectric layer forming step includes forming a dielectric layer (7) on an inner surface of each of the fine pores (60). The conductor layer forming step includes forming a conductor layer (8) including a first conductive part (81) and a second conductive part (82) electrically connected to the first conductive part (81). The first conductive part (81) is in contact with the dielectric layer (7). The second conductive part (82) is in the capacitance generation region (31) of the first surface (21).

With this aspect, the porous part (6) is suppressed from being formed in the non-capacitance generation region (32).

A thirteenth aspect is a method for manufacturing the capacitor (1) of any one of the seventh to twelfth aspects. In the thirteenth aspect, the second masking part (52) has a plurality of through holes (520) extending through the second masking part (52) in a thickness direction defined with respect to the second masking part (52).

With this aspect, the fine pores (60) which the porous part (6) has are easily formed to be elongated along a thickness direction defined with respect to the silicon substrate (2).

REFERENCE SIGNS LIST

1 Capacitor
2 Silicon Substrate
21 First Surface
22 Second Surface
23 Third Surface
24 n-Type Semiconductor Layer
26 Low-Resistance Part
31 Capacitance Generation Region
32 Non-Capacitance Generation Region
4 Groove
41 Insulative Material
42 Insulating Layer
43 Filler Material
5 Masking Layer
51 First Masking Part
52 Second Masking Part
520 Through Hole
6 Porous Part
60 Fine Pore
7 Dielectric Layer
8 Conductor Layer
81 First Conductive Part
82 Second Conductive Part
9 Backside electrode
90 Insulating Layer
L12 Distance
L13 Distance

The invention claimed is:

1. A method for manufacturing a capacitor, the method comprising:

a groove forming step of
preparing a silicon substrate having a first surface and a second surface opposite the first surface, the silicon substrate including a capacitance generation region and a non-capacitance generation region which is a region other than the capacitance generation region when viewed along a direction connecting the first surface and the second surface and
forming a groove at a boundary between the capacitance generation region and the non-capacitance generation region, the groove being recessed from the first surface toward the second surface;
a masking layer forming step of
forming a masking layer on the first surface of the silicon substrate, the masking layer including a first masking part covering the non-capacitance generation region and a second masking part covering the capacitance generation region, and
forming a plurality of through holes extending through the second masking part in a thickness direction defined with respect to the second masking part;
a porous part forming step of
forming a porous part in the capacitance generation region of the silicon substrate by an anodic oxidation process, the porous part having fine pores, and
removing the second masking part after forming the porous part;
a dielectric layer forming step of forming a dielectric layer on inner surfaces of the fine pores; and
a conductor layer forming step of forming a conductor layer including a first conductive part and a second conductive part electrically connected to the first conductive part, the first conductive part being in contact with the dielectric layer, the second conductive part being in the capacitance generation region of the first surface.

2. The method of claim 1, further comprising a filling step of filling an insulative material in the groove.

3. The method of claim 1, further comprising a filling step of
forming an insulating layer on an inner surface of the groove and
filling a filler material in the groove provided with the insulating layer.

4. The method of claim 1, further comprising a filling step, wherein
the silicon substrate is a p-type semiconductor, and
the filling step includes
forming an n-type semiconductor layer on an inner surface of the groove and
filling a filler material in the groove provided with the n-type semiconductor layer.

5. A method for manufacturing a capacitor, the method comprising:

an n-type semiconductor part forming step of
preparing a silicon substrate which is a p-type semiconductor having a first surface and a second surface opposite the first surface, the silicon substrate including a capacitance generation region and a non-capacitance generation region which is a region other than the capacitance generation region when viewed along a direction connecting the first surface and the second surface, and
forming an n-type semiconductor part at a boundary between the capacitance generation region and the non-capacitance generation region, the n-type semiconductor part extending from the first surface toward the second surface;
a masking layer forming step of
forming a masking layer on the first surface of the silicon substrate, the masking layer including a first masking part covering the non-capacitance generation region and a second masking part covering the capacitance generation region, and
forming a plurality of through holes extending through the second masking part in a thickness direction defined with respect to the second masking part;
a porous part forming step of
forming a porous part in the capacitance generation region of the silicon substrate by an anodic oxidation process, the porous part having fine pores, and
removing the second masking part after forming the porous part;
a dielectric layer forming step of forming a dielectric layer on inner surfaces of the fine pores; and
a conductor layer forming step of forming a conductor layer including a first conductive part and a second conductive part electrically connected to the first conductive part, the first conductive part being in contact with the dielectric layer, the second conductive part being in the capacitance generation region of the first surface.

6. A method for manufacturing a capacitor, the method comprising:

a masking layer forming step of
preparing a silicon substrate having a first surface and a second surface opposite the first surface, the silicon substrate including a capacitance generation region and a non-capacitance generation region which is a region other than the capacitance generation region when viewed along a direction connecting the first surface and the second surface, forming a masking layer on the first surface of the silicon substrate, the masking layer including a first masking part covering the non-capacitance generation region and a second masking part covering the capacitance generation region, and forming a plurality of through holes extending through the second masking part in a thickness direction defined with respect to the second masking part;

a porous part forming step of forming a backside electrode having a same shape as the capacitance generation region at a same location as the capacitance generation region on the second surface of the silicon substrate when viewed along a direction connecting the first surface and the second surface, forming a porous part in the capacitance generation region of the silicon substrate by an anodic oxidation process by using the backside electrode as an anode, the porous part having fine pores, and removing the second masking part after forming the porous part;

a dielectric layer forming step of forming a dielectric layer on inner surfaces of the fine pores; and a conductor layer forming step of forming a conductor layer including a first conductive part and a second conductive part electrically connected to the first conductive part, the first conductive part being in contact with the dielectric layer, the second conductive part being in the capacitance generation region of the first surface.

7. The method of claim 6, further comprising an insulating layer forming step of forming an insulating layer on the second surface of the silicon substrate except for part of the second surface on which the backside electrode is provided.

8. The method of claim 6, further comprising a groove forming step of forming a groove around the backside electrode, the groove being recessed from the second surface toward the first surface.

9. The method of claim 8, further comprising a filling step of filling an insulative material in the groove.

10. The method of claim 6, wherein the silicon substrate further has a third surface opposite the first surface, and a distance between the third surface and the first surface is shorter than a distance between the second surface on which the backside electrode is formed and the first surface.

11. A method for manufacturing a capacitor, the method comprising:

a masking layer forming step of preparing a silicon substrate having a first surface and a second surface opposite the first surface, the silicon substrate including a capacitance generation region and a non-capacitance generation region which is a region other than the capacitance generation region when viewed along a direction connecting the first surface and the second surface, forming a masking layer on the first surface of the silicon substrate, the masking layer including a first masking part covering the non-capacitance generation region and a second masking part covering the capacitance generation region, and forming a plurality of through holes extending through the second masking part in a thickness direction defined with respect to the second masking part;

a low-resistance part forming step of forming a low-resistance part having a same shape as the capacitance generation region at a same location as the capacitance generation region in the silicon substrate when viewed along the direction connecting the first surface and the second surface, the low-resistance part having a lower specific resistance than the silicon substrate and extending from the second surface toward the first surface;

a porous part forming step of forming a porous part in the capacitance generation region of the silicon substrate by an anodic oxidation process, the porous part having fine pores, and removing the second masking part after forming the porous part;

a dielectric layer forming step of forming a dielectric layer on inner surfaces of the fine pores; and a conductor layer forming step of forming a conductor layer including a first conductive part and a second conductive part electrically connected to the first conductive part, the first conductive part being in contact with the dielectric layer, the second conductive part being in the capacitance generation region of the first surface.

* * * * *